US011636056B1

(12) United States Patent
Singh et al.

(10) Patent No.: US 11,636,056 B1
(45) Date of Patent: *Apr. 25, 2023

(54) HIERARCHICAL ARBITRATION STRUCTURE

(71) Applicant: Ambarella International LP, Santa Clara, CA (US)

(72) Inventors: Manish Singh, Campbell, CA (US); Dingxin Jin, Milpitas, CA (US)

(73) Assignee: Ambarella International LP, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/876,696

(22) Filed: Jul. 29, 2022

Related U.S. Application Data

(63) Continuation of application No. 17/227,721, filed on Apr. 12, 2021, now Pat. No. 11,461,254, which is a continuation-in-part of application No. 17/165,942, filed on Feb. 3, 2021, now Pat. No. 11,360,890.

(51) Int. Cl.
| | | |
|---|---|---|
| *G06F 13/16* | (2006.01) | |
| *G06F 12/0882* | (2016.01) | |
| *G06F 12/02* | (2006.01) | |
| *G11C 8/18* | (2006.01) | |

(52) U.S. Cl.
CPC ...... *G06F 13/1689* (2013.01); *G06F 12/0238* (2013.01); *G06F 12/0882* (2013.01); *G06F 13/1621* (2013.01); *G06F 13/1642* (2013.01); *G11C 8/18* (2013.01)

(58) Field of Classification Search
CPC ............ G06F 13/1689; G06F 12/0238; G06F 12/0882; G06F 13/1621; G06F 13/1642; G06F 13/1668; G06F 13/1673; G11C 8/18; H04L 49/254
See application file for complete search history.

(56) References Cited

U.S. PATENT DOCUMENTS

| | | | | |
|---|---|---|---|---|
| 7,366,854 | B2 * | 4/2008 | Wastlick | G06F 13/1626 711/160 |
| 8,271,746 | B1 * | 9/2012 | Hutsell | G06F 13/1642 711/156 |
| 2004/0103232 | A1 * | 5/2004 | Clayton | H04L 49/254 710/244 |

(Continued)

*Primary Examiner* — Charles Rones
*Assistant Examiner* — Hewy H Li
(74) *Attorney, Agent, or Firm* — Christopher P. Maiorana, PC

(57) ABSTRACT

An apparatus including a plurality of set arbitration circuits and a die arbitration circuit. The set arbitration circuits may each be configured to receive first commands and second commands and comprise a bank circuit configured to queue bank data in response to client requests and a set arbitration logic configured to queue the second commands in response to the bank data. The die arbitration circuit may be configured to receive the commands from the set arbitration circuits and comprise a die-bank circuit configured to queue die data in response to the client requests and a die arbitration logic configured to queue the second commands in response to the die data. Queuing the bank data and the die data for the second commands may maintain an order of the client requests and prioritize the first commands corresponding to a current controller over the first commands corresponding to a non-current controller.

20 Claims, 9 Drawing Sheets

(56) References Cited

U.S. PATENT DOCUMENTS

2009/0055580 A1* 2/2009 Moscibroda ........ G06F 13/1642
711/E12.001
2009/0083741 A1* 3/2009 Krishnan .............. G06F 9/5016
718/102

\* cited by examiner

HIERARCHICAL ARBITRATION STRUCTURE

This application relates to U.S. Ser. No. 17/227,721, filed on Apr. 12, 2021, which relates to U.S. Pat. No. 11,360,890, filed on Feb. 3, 2021. Each of the mentioned applications are hereby incorporated by reference in its entirety.

FIELD OF THE INVENTION

The invention relates to data access generally and, more particularly, to a method and/or apparatus for implementing a hierarchical arbitration structure.

BACKGROUND

Modern computing demands low latency memory access. With an ever increasing need of more external memory bandwidth, the number of banks in a memory and the speed of memories is increasing. Memory access is efficient when accessing an open page and there is a penalty when there is a page miss. With high speed and high density memory, a page miss penalty also increases. LPDDR4 and LPDDR5 are examples of modern high speed and high density memories. A single LPDDR5 device, can have a 16 banks architecture that can be configured and accessed. However, without proper bank management, the memory access will not provide seamless data transfer.

The latest memories can have a burst size of 64 bytes and can complete a memory access transaction in two command cycles (32 bit DRAM bus). A page miss time (i.e., an amount of time taken to close a page and open another page in the same bank of a memory) can last for 50+ cycles. The page miss penalty results in a significant bandwidth loss.

Applications can be tuned to keep page misses to a minimum but, with so many processes running, page misses are hard to avoid completely. Memory controllers need to properly do page management to hide the time needed to close a page and open another page. To be able to sustain seamless data transfer, the opening and closing of pages in different memory banks need to be managed properly. However, memory controllers are also required to service requests in order to avoid memory coherency issues.

With the complexity of multiple DDR timing constraints and a large number of banks, a single arbitration logic becomes complicated. A complicated single arbitration logic has difficulty meeting the timing requirements in a high frequency system. A single arbitration logic also increases the difficulty in back-end design. Without efficient arbitration logic the advantages of modern memory devices will not be fully utilized.

It would be desirable to implement a hierarchical arbitration structure.

SUMMARY

The invention concerns an apparatus including a plurality of bank set arbitration circuits and a die arbitration circuit. The bank set arbitration circuits may each be configured to receive first commands and second commands and comprise a bank circuit configured to queue bank data in response to client requests and a set arbitration logic configured to queue the second commands in response to the bank data and perform arbitration for the first commands and said second commands. The die arbitration circuit may be configured to receive the first commands and the second commands from the bank set arbitration circuits and comprise a die-bank circuit configured to queue die data in response to the client requests and a die arbitration logic configured to queue the second commands in response to the die data and perform arbitration for the first commands and the second commands. Queuing the bank data and the die data for the second commands may enable the apparatus to maintain an order of the client requests for a random access memory and prioritize the first commands that correspond to a current bank set controller over the first commands that correspond to a non-current bank set controller.

BRIEF DESCRIPTION OF THE FIGURES

Embodiments of the invention will be apparent from the following detailed description and the appended claims and drawings.

DETAILED DESCRIPTION OF THE EMBODIMENTS

Figure 1:
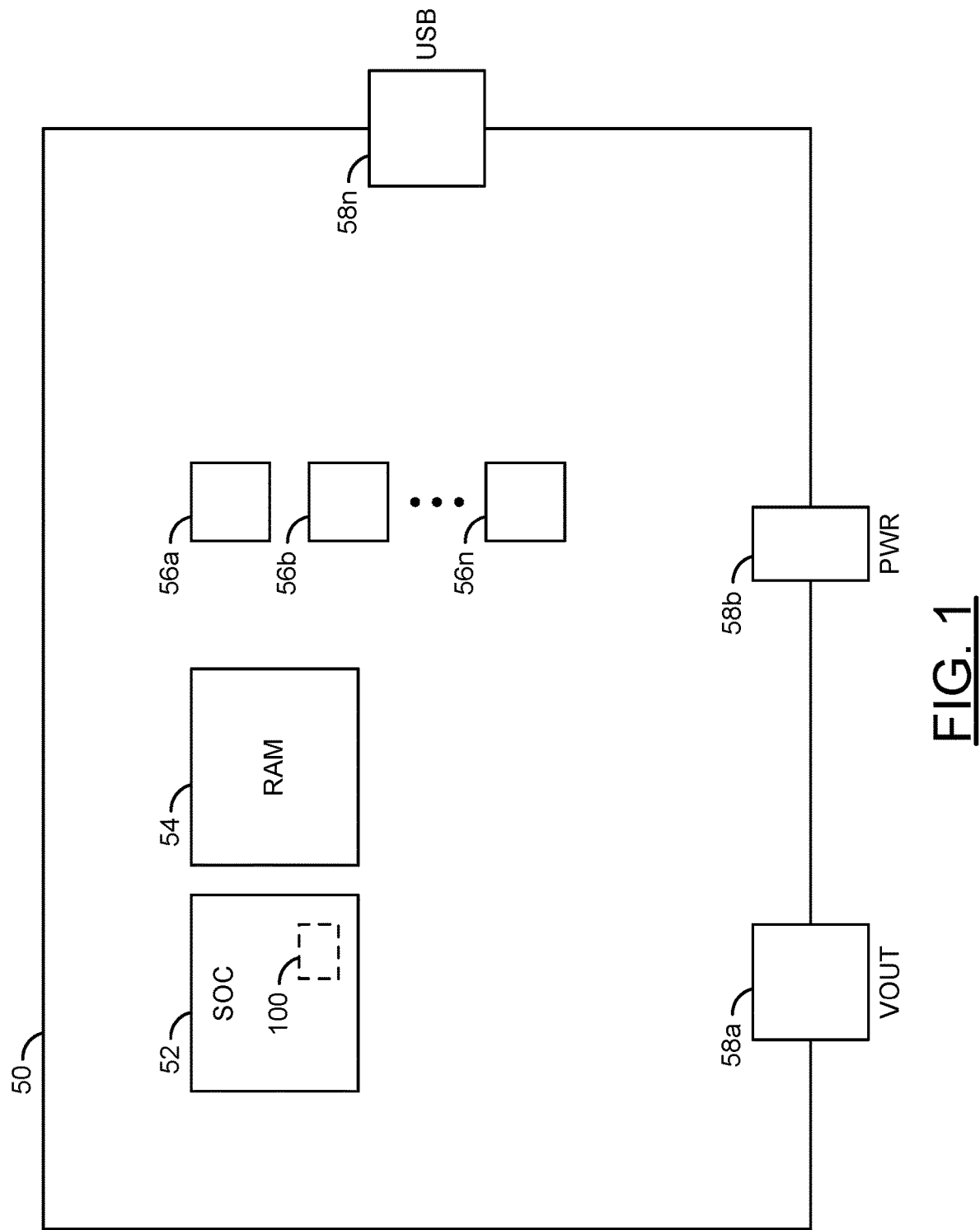
FIG. 1 is a diagram illustrating a context of an example embodiment of the present invention.

Embodiments of the present invention include providing a hierarchical arbitration structure that may (i) enable each memory bank controller to preview requests without being blocked by other requests in the pipeline, (ii) fan out client requests to each corresponding bank set group, then to bank set arbitration and die arbitration, (iii) implement a sideband ordering queue configured to keep an order of client requests to/from said random access memory, (iv) restrict logic to a group of bank controllers in a bank set, (v) manage inter bank timings in bank set arbitration, (vi) manage inter die timings, (vii) enable training and refresh commands to be inserted in any arbitration stage, (viii) satisfy bank specific timing constraints before a request is generated to enable downstream logic to ignore checking for readiness, (ix) enable aggressive page management for a random access memory by opening and closing pages appropriately, (x) enable client requests to be serviced in order, (xi) be implemented in memory controllers for LPDDR4 and LPDDR5 memory and/or (xii) be implemented as one or more integrated circuits.

Embodiments of the present invention may be configured to implement a hierarchical arbitration structure for servicing client requests for a random access memory. The hierarchical arbitration structure may be configured to operate with a random access memory that comprises a banks and pages structure. The random access memory may implement a dynamic random access memory (e.g., DRAM). The type of random access memory that the hierarchical arbitration structure operates with may be varied according to the design criteria of a particular implementation.

The hierarchical memory structure may comprise a design where a client request fans out to a bank set (e.g., a group of bank controllers where a status of each bank is managed independently), followed by a bank set arbitration and then followed by die arbitration for multiple dies. The hierarchical memory structure may be configured to maintain an ordering of client requests and ensure timing requirements of the random access memory are met to ensure a seamless data transfer and take advantage of the bandwidth capabilities of the random access memory. To keep the client request ordering in place, the hierarchical memory structure may comprise a side band ordering queue. The side band ordering queue may comprise a first queue (e.g., a bank circuit queue) and a second queue (e.g., a die-bank circuit queue).

Keeping the client request ordering in place may enable various arbitration stages to be decoupled and pipelined. The side band ordering queue may also be configured to prioritize near-future commands over far-future commands. Peeking ahead at the ordering information in the side band ordering queue (e.g., peeking at future elements enqueued) may enable a command sequence to be generated that takes advantage of the characteristics of the upcoming commands. For example, commands that correspond to a current bank set controller may be given higher priority than commands that correspond to a non-current bank set controller.

The hierarchical arbitration logic may be configured to restrict a fan of logic cone to a group of bank controllers in a bank set. Restricting the fan of logic cone to a group of bank controllers may enable a higher clock speed and better physical design than a single arbitration logic. The hierarchical arbitration logic may be configured to manage inter-bank timings in bank set arbitration. The hierarchical arbitration logic may be configured to manage inter-die timings in die arbitration. In an example, using the hierarchical arbitration logic, the inter-bank timings and the inter-die timings may be controlled independently. The hierarchical arbitration logic may be configured to enable specific commands to be flexibly inserted in any arbitration stage based on system requirements. In an example, one of the commands may be a refresh command. In another example, one of the commands may be a training command. The types of commands that may be inserted using the hierarchical arbitration logic may be varied according to the design criteria of a particular implementation.

The hierarchical arbitration structure may comprise multiple arbitration sections. One section of the hierarchical arbitration structure may be a bank-set controller (BSC). The BSC may be configured to arbitrate with multiple banks in a particular memory bank set. One section of the hierarchical arbitration structure may be a bank set arbitration (BRB). The BRB may be configured to arbitrate with multiple bank-sets. One section of the hierarchical arbitration structure may be a die arbitration logic (DRB). The DRB may be configured to arbitrate with multiple dies.

The BSC may comprise a common request circuit. The common request circuit may implement a request queue (e.g., RQUE). The BSC may comprise multiple page circuits. The page circuits may be configured to provide a queue per bank (e.g., PQUE) for activate and/or precharge commands. A total number of memory banks per die of the random access memory may be equally divided among bank set controllers (e.g., M bank set controllers may be implemented, where M may be 2, 4, or 8 for a DRAM with 16 banks). Details of the RQUE circuits, the PQUE circuits and/or the structure of the memory controller for the random access memory may be described in detail in association with FIG. 3 and FIG. 4.

Referring to FIG. 1, a diagram illustrating a context of an example embodiment of the present invention is shown. A circuit 50 is shown. The circuit 50 may implement a computing device. In one example, the computing device 50 may be a computer motherboard (e.g., an ATX motherboard, a mATX motherboard, a laptop motherboard, etc.). In another example, the computing device 50 may be a portable device (e.g., a main board for a smartphone, a main board for a tablet computing device, a motherboard for a Raspberry Pi computing device, etc.). In yet another example, the computing device 50 may be a main board for application-specific devices (e.g., a digital camera). The types of computing devices may be varied according to the design criteria of a particular implementation.

The circuit 50 may comprise a block (or circuit) 52, a block (or circuit) 54, blocks (or circuits) 56a-56n and/or blocks (or circuits) 58a-58n. The circuit 52 may implement a processor. The circuit 54 may implement a memory. The circuits 56a-56n may implement various modules. The circuits 58a-58n may implement various input/output controllers. The circuit 50 may comprise other components (not shown). The number, type and/or arrangement of the components of the circuit 50 may be varied according to the design criteria of a particular implementation.

The processor 52 may be configured to execute computer readable instructions. The processor 52 may be configured to receive input, perform various operations on the input received and generate output and/or update internal registers in response to the operations performed. The processor 52 may be configured to access the memory 54. For example, the processor 52 may be configured to receive input from the memory 54 and write output to the memory 54.

The processor 52 is shown comprising a block (or circuit) 100. The circuit 100 may be a module configured to implement the hierarchical arbitration logic. The hierarchical arbitration logic implemented by the circuit 100 may be configured to enable efficient memory access by the processor 52 to/from the memory 54. In an example, the circuit 100 may be a component of a memory controller of the processor 52.

In the example shown, the processor 52 may be a system-on-chip (SoC). In one example, the processor 52 may be an ARM-based processor. In another example, the processor 52 may implement an x86 (or x86-64) architecture. In yet another example, the processor 52 may implement a RISC architecture. Generally, the processor 52 may be any type of processor that uses an external dynamic random access memory chip and/or module. The type of the processor 52 implementing the hierarchical arbitration logic of the circuit 100 may be varied according to the design criteria of a particular implementation.

The memory 54 may implement a random access memory (RAM). The memory 54 may be a high speed and high density memory. The memory 54 may be accessed by the processor 52. The memory 54 may provide an external memory for the processor 52.

In one example, the memory 54 may implement a Low-Power Double Data Rate, generation 5 (LPDDR5) memory. In another example, the memory 54 may implement a Low-Power Double Data Rate, generation 4 (LPDDR4) memory. In the example shown, the memory 54 may be an embedded component on the circuit 50. In some embodiments, the memory 54 may implement a Double Data Rate 5 Synchronous Dynamic Random-Access Memory (DDR5 SDRAM) (or earlier or later generation). In some embodiments, the memory 54 may be implemented as a DIMM or SODIMM. In an example, the memory 54 may be removable and/or enable adding increased capacity. Generally, the memory 54 may comprise any type of memory configured with a memory bank and pages structure. The type, format, speed, bandwidth and/or specification of the memory 54 may be varied according to the design criteria of a particular implementation.

The modules 56a-56n may implement various components of the circuit 50. In an example, the modules 56a-56n may comprise an audio controller, a video controller, a wireless controller, sensors, etc. In some embodiments, data generated by the modules 56a-56n may be presented to the processor 52 and stored in the memory 54. In one example, one or more of the modules 56a-56n may provide client requests to the processor 52 for accessing the memory 54.

The input/output (I/O) controllers 58a-58n may be configured to connect to various devices. In the example shown, the I/O controller 58a may generate a signal (e.g., VOUT), the I/O controller 58b may receive a power input (e.g., a power supply) and the I/O controller 58n may implement a USB controller. The I/O controllers 58a-58n may be configured to implement various protocols for communicating with external devices. In one example, data generated by the processor 52 in response to accessing the memory 54 may be communicated to external devices using the I/O controllers 58a-58n. In another example, data received by the I/O controllers 58a-58n may be presented to the processor 52 to be stored in the memory 54. In some embodiments, the I/O controllers 58a-58n may be configured to generate client requests to the processor 52 for accessing the memory 54.

Figure 2:
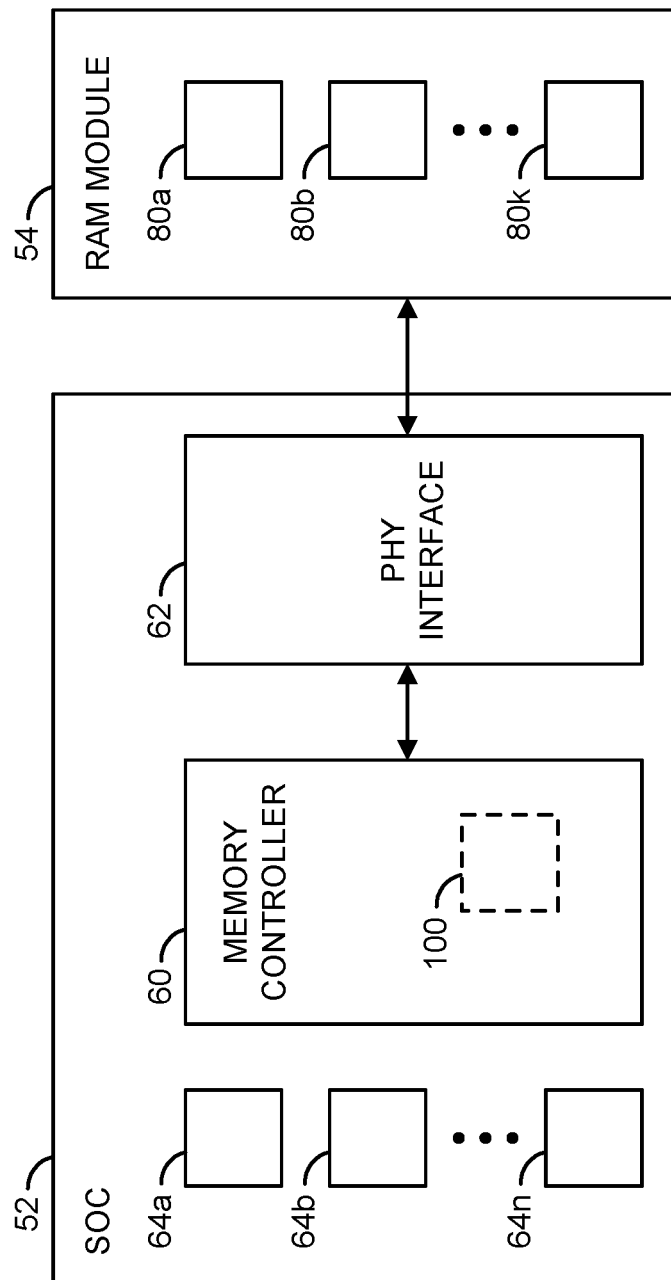
FIG. 2 is a diagram illustrating an example embodiment of the present invention implemented as part of a system-on-chip (SoC) connected to a memory.

Referring to FIG. 2, a diagram illustrating an example embodiment of the present invention implemented as part of a system-on-chip (SoC) connected to a memory is shown. The SoC 52 is shown connected to the memory 54. The SoC 52 may be configured to access (e.g., write to, read from) the memory 54.

The SoC 52 may comprise a block (or circuit) 60, a block (or circuit) 62 and/or blocks (or circuits) 64a-64n. The circuit 60 may implement a memory controller. The circuit 62 may implement a physical interface. The circuits 64a-64n may implement various modules. The SoC 52 may comprise other components (not shown). The number, type and/or arrangement of the components of the SoC 52 may be varied according to the design criteria of a particular implementation.

The memory controller 60 may be configured to manage data written to and data read from the memory 54. The memory controller 60 may be configured to select row and column data addresses of the memory 54, control the opening and closing of pages of the memory 54 and/or operate in compliance with a specification of the type of memory implemented by the memory 54. The memory controller 60 is shown connected to the physical interface 62. The memory controller 60 may implement the circuit 100. The memory controller 60 may utilize the circuit 100 to implement the arbitration logic that fans out client requests to a bank set, followed by a bank set arbitration and then followed by die arbitration for multiple dies.

The physical interface 62 may be configured to enable communication between the SoC 52 and the memory 54. The physical interface 62 may be configured to perform low level signaling to the memory 54. In an example, the physical interface 62 may implement a DFI specification. In an example, the memory controller 60 may be configured to convert a physical address and forward an address field to the physical interface 62. The address fields may be inputs to the multiplexer circuit of the physical interface 62. A demultiplexer on the memory 54 may use the converted inputs to select the corresponding memory location and return the data, which is then passed back through the multiplexer of the physical interface 62 to consolidate the data in order to reduce the required bus width for the operation.

The modules 64a-64n may implement various functionality of the SoC 52. In one example, one or more of the modules 64a-64n may implement registers. In another example, one or more of the modules 64a-64n may implement user logic. The types of modules 64a-64n implemented by the SoC may be varied according to the design criteria of a particular implementation.

The memory 54 may comprise blocks (or circuits) 80a-80n. The blocks 80a-80n may represent memory dies. The memory dies 80a-80n may be one component of the memory hierarchy of the memory 54. The memory dies 80a-80n may be one type of logical unit (or storage unit) of the memory 54. Each of the memory dies 80a-80n may share address lines and/or data lines but may be read from or written to based on a chip select value. The memory 54 may comprise other components (not shown). The capacity and/or process size of each of the memory dies 80a-80n may be varied according to the design criteria of a particular implementation.

Figure 3:
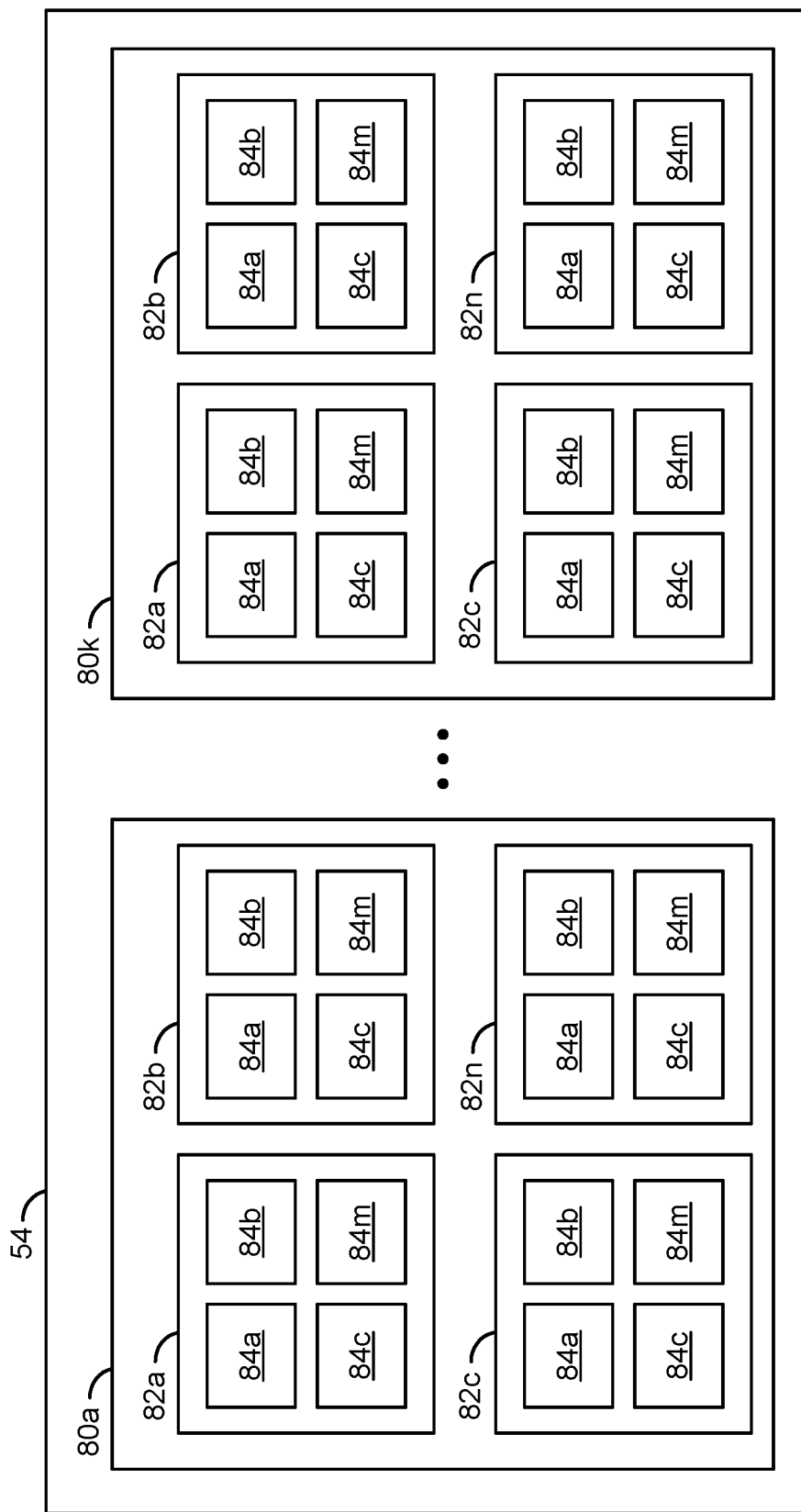
FIG. 3 is a diagram illustrating an example structure of a random access memory that may be accessed using the hierarchical arbitration logic.

Referring to FIG. 3, a diagram illustrating an example structure of a random access memory that may be accessed using the hierarchical arbitration logic is shown. A structure of the memory 54 is shown as an illustrative example. The structure shown may be one example DRAM configuration that may be compatible with the hierarchical arbitration logic implemented by the circuit 100.

The memory 54 is shown comprising the memory dies 80a-80k. Each of the memory dies 80a-80k may comprise blocks (or circuits) 82a-82n. The blocks 82a-82n may implement bank sets. Each of the bank sets 82a-82n may comprise blocks (or circuits) 84a-84m. The blocks 84a-84m may comprise memory banks. The memory banks 84a-84m may comprise a set of rows and columns of data storage units.

In the example shown, each of the memory dies 80a-80k may comprise four of the bank sets 82a-82n (e.g., a memory group). In the example shown, each of the bank sets 82a-82n may comprise four of the memory banks 84a-84m. In the example shown, each of the memory dies 80a-80k may comprise 16 of the memory banks 84a-84m. In some embodiments, the memory dies 80a-80k may have other DRAM configurations (e.g., 2 banks, 8 banks, etc.). The number of bank sets 82a-82n and/or the number of memory banks 84a-84m per each of the bank sets 82a-82n may be varied according to the design criteria of a particular implementation.

Generally, multiple of the memory banks 84a-84m may be active at any one time. However, only one of the memory banks 84a-84m may be carrying out a data transfer at any one time. A page may be a unique address made up of one of the bank sets 82a-82n, one of the memory banks 84a-84m and a row address. Each of the banks 84a-84m may have one active page at any given time. The circuit 100 may be configured to operate with any type of random access memory with a banks and page structure.

The memory controller 60 may be configured to efficiently schedule operations of the memory 54 to reduce latency and/or to utilize low power modes of the memory 54 when possible. The memory controller 60 may be configured to implement a page policy to determine when to close pages in the memory 54. The circuit 100 may enable the page policy implemented by the memory controller 60 to effectively limit power consumption while enabling high bandwidth performance.

Generally, when the processor 52 needs access to data in the memory 54, the processor 52 may issue a request to the memory controller 60 (e.g., a client request). The memory controller 60 may determine an appropriate sequence and timing of DRAM commands to fulfill the client request. For example, to access data in the memory 54, the memory controller 60 may determine whether a desired one of the memory dies 80a-80k has a clock enabled, check a state of the desired one of the memory banks 84a-84m, check if which row is active, determine if the active row is the same as the desired row, close a row (if necessary) and/or issue read/write commands.

A page-hit may be when a read or write (e.g., a client request) is issued by the memory controller 60 to a currently open page of one of the memory banks 84a-84m. If a page is currently open and the client request is for access to another page, then there may be a page miss. A page miss may result in a bandwidth loss. The circuit 100 may be configured to implement the hierarchical arbitration logic to maintain an ordering of client requests and ensure timing requirements of the memory 54 are met to ensure a seamless data transfer to take advantage of the bandwidth capabilities of the memory 54.

Figure 4:
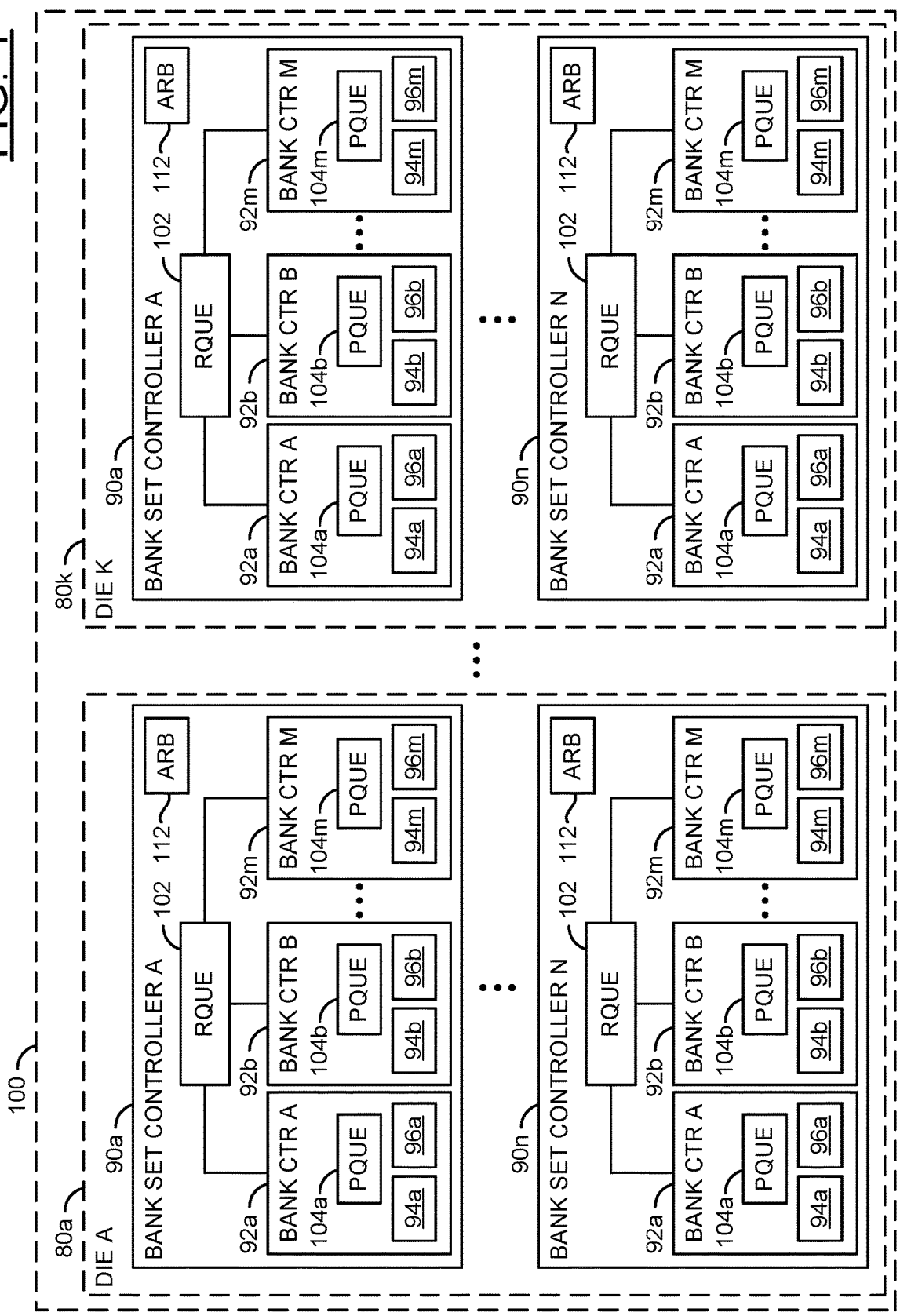
FIG. 4 is a block diagram illustrating common request circuits and multiple page circuits in a bank set controller.

Referring to FIG. 4, a block diagram illustrating common request circuits and multiple page circuits in a bank set controller is shown. An example embodiment of a portion of the apparatus 100 is shown. The portion of the apparatus 100 may be implemented as part of the memory controller 60. The portion of the apparatus 100 is shown with respect to the memory dies 80a-80k. While the memory dies 80a-80k are shown for reference, the memory dies 80a-80k may not be implemented as part of the memory controller 60. The memory dies 80a-80k are illustrated to represent how the memory controller 60 and/or the apparatus 100 interacts with the memory dies 80a-80k.

The portion of the apparatus 100 shown may comprise one of a number of blocks (or circuits) 90a-90n implemented by the memory controller 60. The blocks 90a-90n may each implement a bank set controller. The bank set controllers 90a-90n may correspond to the bank sets 82a-82n for each of the memory dies 80a-80k. For example, the memory controller 60 may implement the bank set controllers 90a-90n for each of the memory dies 80a-80k.

The bank set controller 90a-90n may be configured to manage memory access to the corresponding bank sets 82a-82n shown in association with FIG. 3. For example, N of the bank set controllers 90a-90n may be implemented for the N bank sets 82a-82n implemented on one of the dies 80a-80k. In an example, for K of the memory dies 80a-80k that each implement N of the memory bank sets 82a-82n, the memory controller 60 may implement K*N of the bank set controllers 90a-90n.

Each of the bank set controllers 90a-90n may comprise a block (or circuit) 102, a block (or circuit) 112 and/or a number of blocks (or circuits) 92a-92m. The circuit 102 may implement a common request circuit. The circuit 112 may implement arbitration logic (e.g., a bank set arbitration logic). Each of the circuits 92a-92m may comprise bank controllers. The bank set controllers 90a-90n may comprise other components (not shown). The number, type and/or arrangement of the components of each of the bank set controllers 90a-90n may be varied according to the design criteria of a particular implementation.

The common request circuit 102 may be configured as a common request queue (e.g., RQUE). The common request circuit 102 may implement a first-in-first-out buffer. The common request circuit 102 may be implemented within each of the bank set controllers 90a-90n. The common request circuit 102 may be shared by each of the bank controllers 92a-92m within one of the bank set controllers 90a-90n (e.g., each implementation of the bank set controllers 90a-90n may comprise one implementation of the common request circuit 102). In example shown, there may be M bank controllers 92a-92m within each of the bank set controllers 90a-90n. The common request circuit 102 may be shared by M of the bank controllers 92a-92m.

The arbitration logic 112 may be configured to allocate access to the memory 54 (e.g., the memory banks 84a-84m of one of the bank sets 82a-82n). The arbitration logic 112 may be configured to implement bank preparation for any operations intended for a closed row. The arbitration logic 112 may be configured to read or write data to open rows. The arbitration logic 112 may be configured to perform various manager operations such as memory refreshes. The arbitration logic 112 may be configured to generate active commands (ACT) or precharge commands (PCHG). The activate command and the precharge command may be page management commands.

The bank controllers 92a-92m may each be configured to manage memory access to corresponding memory banks 84a-84m. In an example, the bank controller 92a of the bank set controller 90a of the memory die 80a may manage memory access to the memory bank 84a of the bank set 82a of the memory die 80a, the bank controller 92b of the bank set controller 90a of the memory die 80a may manage access to the memory bank 84b of the bank set 82a of the memory die 80a, the bank controller 92a of the bank set controller 90b of the memory die 80b may manage memory access to the memory bank 84a of the bank set 82b of the memory die 80b, etc. The number of memory bank controllers 92a-92m implemented within each of the bank set controllers 90a-90n may correspond to the number of memory banks 84a-84m implemented within a corresponding one of the memory bank sets 82a-82n. In the example shown, each of the memory dies 80a-80k may implement M of the memory banks 84a-84m within each of the bank sets 82a-82n and the memory controller 60 may implement M of the memory bank controllers 92a-92m within each of the bank set controllers 90a-90n.

Each of the bank controllers 92a-92m may comprise a corresponding one of the blocks (or circuits) 94a-94m, a corresponding one of the blocks (or circuits) 96a-96m and/or a corresponding one of the blocks (or circuits) 104a-104m. The circuits 94a-94m may each implement bank control logic. The circuits 96a-96m may each implement one or more page info registers. The circuits 104a-104m may each implement a page circuit. Each of the bank controllers 92a-92m may comprise other components (not shown). The number, type and/or arrangement of the components of the bank controllers 92a-92m may be varied according to the design criteria of a particular implementation.

The bank control logic 94a-94m may comprise various circuitry (e.g., logic gates, registers, multiplexers, etc.). The bank control logic 94a-94m may be configured to control access to the memory banks 84a-84m. Generally, the bank control logic 94a-94m from one of the bank controllers 92*a*-92*m* may operate independent from the bank control logic 94*a*-94*m* from another one of the bank controllers 92*a*-92*m*.

The page info registers 96*a*-96*m* may be configured to store data that indicates whether pages in the memory banks 84*a*-84*m* are opened or closed (e.g., the page status). The page info registers 96*a*-96*m* may provide the page status for each page within the corresponding one of the memory banks 84*a*-84*m* controlled by the respective bank controllers 92*a*-92*m*. The page info registers 96*a*-96*m* may indicate the page status by storing a valid bit and a page ID (e.g., {valid, page_id}).

Each of the memory banks 84*a*-84*m* may comprise multiple pages. The page ID value stored in the page info registers 96*a*-96*m* may provide a reference to a particular page within the corresponding one of the memory banks 84*a*-84*m*. The valid value stored in the page info registers 96*a*-96*m* may indicate whether a particular one of the pages is open or closed. In one example, the valid value may be represented by a bit flag. Whether a value of '1' (or logical high) or a value of '0' (or logical low) indicates that a page is opened or closed may be varied according to the design criteria of a particular implementation.

The page circuits 104*a*-104*m* may be configured as a page queue (e.g., PQUE). The page circuits 104*a*-104*m* may each implement a first-in-first-out buffer. Each of the page circuits 104*a*-104*m* may be implemented with half the storage depth of the common request circuit 102. One of the page circuits 104*a*-104*m* may be implemented within each of the bank controllers 92*a*-92*m*. Each of the page circuits 104*a*-104*m* may operate independently from each other for one of the bank controllers 92*a*-92*m* within one of the bank set controllers 90*a*-90*n*. In the example shown, since there are M bank controllers 92*a*-92*m* within each of the bank set controllers 90*a*-90*n*, M of the page circuits 104*a*-104*m* may be implemented within each of the bank set controllers 90*a*-90*n*.

The common request circuit 102 may be shared by the multiple page circuits 104*a*-104*m*. In an example, N*M of the page circuits 104*a*-104*m* may be implemented for each of the memory dies 80*a*-80*k*, where M is the number of the bank controllers 92*a*-92*m* implemented per bank set and N is the number of bank set controllers 90*a*-90*n* implemented per memory die.

Implementing one of the common request circuits 102 as a shared first-in-first-out queue in each of the bank set controllers 90*a*-90*n* may provide a timing-area balance. The common request circuit 102 may be configured to store the client requests generated by the processor 52. The client requests stored by the common request circuit 102 may be popped off the queue when a command (e.g., a column address strobe (CAS) command) has been performed by back end logic. The client requests stored by the common request circuit 102 may comprise information configured to enable memory access. For example, the information in the client request may comprise an address (e.g., a bank, a row, a column, etc.) and/or an access category (e.g., read, write, masked-write, etc.).

The client request stored in a top element of the queue of the common request circuit 102 (e.g., the first out element), may be serviced in response to the common request circuit 102 checking one of the page info registers 96*a*-96*m* and the client request stored in a second element (e.g., the subsequent element) of the queue. In one example, the common request circuit 102 may serve the client request stored in the top element by issuing an activate (e.g., ACT) command if the page corresponding to the address of the client request is closed. In another example, the common request circuit 102 may serve the client request stored in the top element by issuing the CAS command if the page corresponding to the address of the client request is already open (e.g., a page hit is detected by the corresponding one of the page info registers 96*a*-96*m*). In yet another example, the common request circuit 102 may serve the client request stored in the top element by issuing the CAS command with an automatic precharge (e.g., a CAS-AP command), if there is a page miss detected between the second element and the top element in the common request circuit 102.

The commands in the common request circuit 102 may be serviced in order (e.g., the first-in first-out order). Implementing the single shared common request circuit 102 alone for each of the memory banks 92*a*-92*m* (e.g., without the page circuits 104*a*-104*m*) may be too restrictive to enable the client requests to be serviced in order. Implementing one of the common request circuits 102 for each of the bank controllers 92*a*-92*m* (e.g., instead of the page circuits 104*a*-104*m*) may significantly increase the area of the bank set controllers 90*a*-90*n* due to the number of the memory banks 84*a*-84*m*. For example, there may be 16 of the memory banks 84*a*-84*m* per each of the memory dies 80*a*-80*k* in LPDDR5 memory. Implementing the page circuits 104*a*-104*m* instead of multiple common response circuits 102 for each of the bank controllers 92*a*-92*m* may provide a balance between area and timing. The bank set controllers 90*a*-90*n* may provide the common request circuit 102 shared across multiple of the memory bank controllers 92*a*-92*m* and the page circuits 104*a*-104*m* implementing another queue per memory bank. The page circuits 104*a*-104*m* may be implemented with half the size of the common request circuit 102. Implementing the common request circuit 102 with twice the size of each of the page circuits 104*a*-104*m* may provide memory management that may be as effective as page management if an independent one of the common request circuits 102 were implemented per memory bank 84*a*-84*m* but consume less storage area compared to implementing one of the common request circuits 102 per each of the memory bank controllers 92*a*-92*m*.

The page circuits 104*a*-104*m* may each implement one first-in-first-out queue for each of the memory banks 84*a*-84*m*. Each of the page circuits 104*a*-104*m* may be implemented with half of the storage depth of the common request circuit 102. Each of the page circuits 104*a*-104*m* may be configured to store an address. The address stored by each of the page circuits 104*a*-104*m* may be row addresses. Storing only the row addresses may enable the page circuits 104*a*-104*m* to use less area (e.g., compared to implementing multiple common request circuits 102 per memory bank). The row addresses for the potential commands may be pushed into the page circuits 104*a*-104*m* whenever a bank switch occurs.

The page circuits 104*a*-104*m* may be configured to access the respective one of the page info registers 96*a*-96*m* to determine whether the row address stored in the top element (e.g., the first out element) has a hit or miss (e.g., determine whether the corresponding page is already the open page). The corresponding one of the bank controllers 92*a*-92*m* may issue the activate command to open the row address stored in the top element of the page circuits 104*a*-104*m*. The activate command (ACT) may be configured to open a row in a bank to make the row accessible for subsequent write (WR) and read (RD) operations. The activate (ACT) command may be configured to select the bank, bank group, and row to be activated. The corresponding one of the bank controllers 92*a*-92*m* may issue the precharge command (e.g., PCHG) if the row address stored in the top element of the page circuits 104a-104m has a page miss. The precharge (PCHG) command may be configured to de-activate a currently open row. Since only one row may be opened at a time, the precharge command may be issued before the activate command may be issued for opening a different row.

Figure 5:
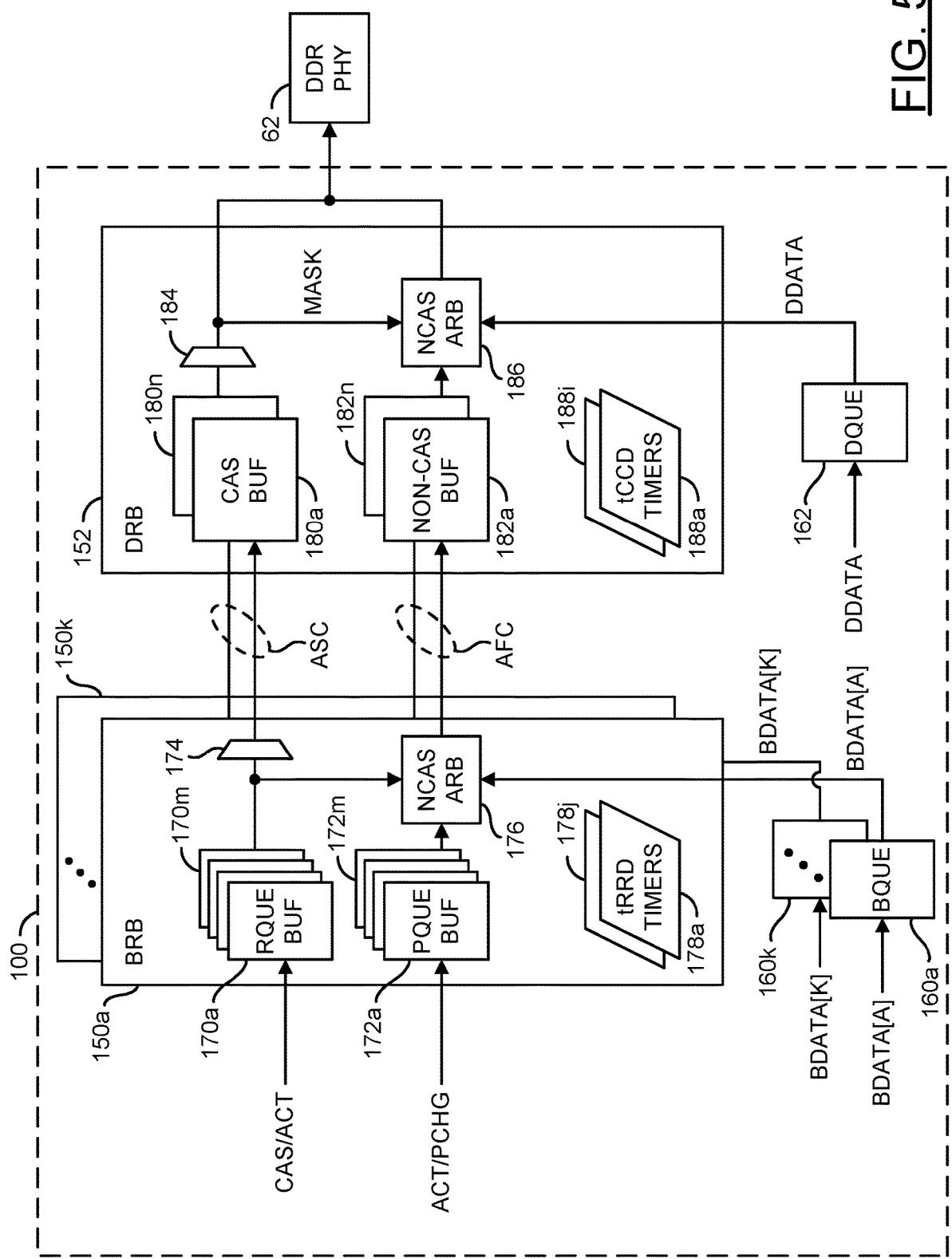
FIG. 5 is a block diagram illustrating an example embodiment of the present invention.

Referring to FIG. 5, a block diagram illustrating an example embodiment of the present invention is shown. The physical interface 62 and the hierarchical arbitration logic 100 are shown. The hierarchical arbitration logic 100 may further comprise the portion of the hierarchical arbitration logic 100 shown in association with FIG. 4 (e.g., the bank set controllers 90a-90n). The hierarchical arbitration logic 100 may be implemented in order to decouple various arbitration stages. Decoupling the arbitration stages may enable the hierarchical arbitration logic 100 to facilitate physical-design. The hierarchical arbitration logic 100 may be configured to scale well when a number of banks and/or dies is increased (e.g., the hierarchical arbitration logic 100 may efficiently perform page management independent from the number of banks and/or dies of the random access memory 54).

The hierarchical arbitration logic 100 may comprise blocks (or circuits) 150a-150k, a block (or circuit) 152, blocks (or circuits) 160a-160k and/or a block (or circuit) 162. The circuits 150a-150k may implement bank set arbitration circuits (BRB). The circuit 152 may implement a die arbitration circuit (DRB). The circuits 160a-160k may implement a bank circuit (BQUE). The circuit 162 may implement a die-bank circuit (DQUE). The hierarchical arbitration logic 100 may comprise other components (not shown). The number, type and/or arrangement of the components of the hierarchical arbitration logic 100 may be varied according to the design criteria of a particular implementation.

The bank set arbitration circuits 150a-150k may be configured to receive commands. The commands may comprise a signal (e.g., CAS/ACT) and/or a signal (e.g., ACT/PCHG). In an example, one type of command received may be a column address strobe (CAS) command. In another example, one type of command received may be an activate (ACT) command for a current client request. In yet another example, one type of command received may be an activate (ACT) command for a future (e.g., upcoming) client request. In still another example, one type of command received may be a precharge (PCHG) command for a future client request.

The commands received by the bank set arbitration circuits 150a-150k may be transmitted by the bank set controllers 90a-90n (e.g., generated in response to arbitration performed by the arbitration circuit 112 shown in association with FIG. 4). One of the bank set arbitration circuits 150a-150k may be implemented for a respective one of the dies 80a-80k (e.g., one bank set arbitration circuit per die). Each of the bank set arbitration circuits 150a-150k may be shared among the multiple bank set controllers 90a-90n implemented on one die. In one example, the bank set arbitration circuit 150a may be shared among the bank set controllers 90a-90n implemented on the die 80a, the bank set arbitration circuit 150b may be shared among the bank set controllers 90a-90n implemented on the die 80b, etc. In an example, the bank set arbitration circuit (BRB) 150a may receive commands from the die 80a and may connect to the bank set controllers 90a-90n implemented on the die 80a. Sharing the various bank set arbitration circuits 150a-150k with the bank set controllers 90a-90n may decouple the arbitration stages for the hierarchical arbitration logic 100 (e.g., each arbitration stage may operate independently from each other and/or may be pipelined). The number of bank set arbitration circuits 150a-150k implemented by the hierarchical arbitration logic 100 may depend on the number of the dies 80a-80k implemented by the memory 54.

The client requests that are CAS commands may be sent from the RQUE circuit 102 of one of the bank set controllers 90a-90n. The RQUE circuit 102 may be implemented to ensure that an order of the CAS commands is strictly maintained. The activate (e.g., ACT) commands and/or the precharge (e.g., PCHG) commands may be generated by the independent bank controllers 92a-92m within the bank set controllers 90a-90n based on a top (e.g., highest in the queue) entry of the PQUE circuits 104a-104m and the RQUE circuit 102. Timing constraints for the memory banks 84a-84m of the memory 54 (e.g., tRCD, tRP, tRTP, tWTP, etc.) may be satisfied by the bank set controllers 90a-90n. For example, the bank controllers 92a-92m and/or the arbitration circuit 112 may ensure that the timing requirements are satisfied before generating the commands. Ensuring that the timing constraints are met at the level of the bank set controllers 90a-90n of the hierarchical arbitration logic 100 may enable the downstream logic (e.g., the bank set arbitration circuits 150a-150k and/or the die arbitration circuit 152) in the hierarchical arbitration logic 100 to ignore checking for readiness of the client requests received. The arbitration circuit 112 may be configured to perform bank arbitration since there may be multiple bank controllers 92a-92m generating the ACT and PCHG commands. In one example, the arbitration circuit 112 may be configured to perform a round-robin arbiter. In another example, the arbitration circuit 112 may be configured to perform a sophisticated arbitration scheme that may consider the order of requests that are pushed into the RQUE 102.

The bank circuits 160a-160k and the die-bank circuit 162 may be configured as a sideband ordering queue. The sideband ordering queue may be configured to keep an order of client requests to/from memory 54. The sideband ordering queue may be configured to prioritize commands that are near-future over commands that are far-future. In an example, commands that are near-future and commands that are far-future may be determined based on an order of the commands stored in the bank circuits 160a-160k and/or the die-bank circuit 162. In the example shown, the bank circuits 160a-160k may be shown as separate components from the bank set arbitration circuits 150a-150k and the die-bank circuit 162 may be shown as separate component from the die arbitration circuit 152. In some embodiments, the bank circuits 160a-160k may be a component of a respective one of the bank set arbitration circuits 150a-150k and the die-bank circuit 162 may be a component of the die arbitration circuit 152.

The bank set arbitration circuits 150a-150k may each comprise blocks (or circuits) 170a-170m, blocks (or circuits) 172a-172m, a block (or circuit) 174, a block (or circuit) 176 and/or blocks (or circuits) 178a-178j. The circuits 170a-170m may comprise RQUE buffers. The circuits 172a-172m may comprise PQUE buffers. The circuit 174 may implement a multiplexer. The circuit 176 may implement a set arbitration logic. The circuits 178a-178j may implement timers. The bank set arbitration circuits 150a-150k may comprise other components (not shown). The number, type and/or arrangement of the components of the bank set arbitration circuits 150a-150k may be varied according to the design criteria of a particular implementation.

The CAS and/or ACT commands for current client requests may be generated by RQUE circuits (e.g., the common request circuits 102) implemented by the bank set controllers 90a-90n. The ACT and/or PCHG commands for future (e.g., upcoming) client requests may be generated by the PQUE circuits (e.g., the page circuits 104a-104m) implemented by the bank controllers 92a-92m of the bank set controllers 90a-90n. Details of the RQUE circuits and/or the PQUE circuits may be described in association with U.S. application Ser. No. 17/165,942, filed on Feb. 3, 2021, appropriate portions of which are hereby incorporated by reference.

The CAS and/or ACT commands for current client requests may be received by the RQUE buffers 170a-170m. The ACT and/or PCHG commands for upcoming client requests may be received by the PQUE buffers 172a-172m. While the RQUE buffers 170a-170m and the PQUE buffers 172a-172m are shown as components of the bank set arbitration circuit 150a for illustrative purposes, one or more of the RQUE buffers 170a-170m and/or the PQUE buffers 172a-172m may be implemented by each of the bank set arbitration circuits 150a-150k. In an example, the number of RQUE buffers 170a-170m and/or the number of PQUE buffers 172a-172m may vary based on the number of memory banks 84a-84m serviced by each of the bank set controllers 90a-90n.

The multiplexer 174 may be configured to receive the CAS commands for the current client requests. The RQUE buffers 170a-170m may present the CAS requests to the multiplexer 174. The multiplexer 174 may present a signal (e.g., ASC) to the die arbitration circuit 152. The signal ASC may comprise the CAS requests arbitrated from each of the bank set arbitration circuits 150a-150k.

The set arbitration logic 176 may be implemented one per die (e.g., one set arbitration logic 176 may be implemented per bank set arbitration circuit 150a-150k) and may be shared by the bank controllers 90a-90n of the same die. The set arbitration logic 176 may be configured to receive the ACT commands from the current client requests, the ACT commands for upcoming client requests and/or the PCHG commands for upcoming client requests. The RQUE buffers 170a-170m may present the ACT commands from the current client requests to the set arbitration logic 176. The PQUE buffers 172a-172m may present the ACT commands and/or the PCHG commands for upcoming client requests to the set arbitration logic 176. The set arbitration logic 176 may present a signal (e.g., AFC) to the die arbitration circuit 152. The signal AFC may comprise the ACT commands for current client requests, the ACT commands for upcoming client requests and/or the PCHG commands for upcoming client requests that have been arbitrated from each of the bank set arbitration circuits 150a-150k. The set arbitration logic 176 may arbitrate the ACT commands and/or PCHG commands according to a priority. In an example, the set arbitration logic 176 may be configured to give higher priority to ACT commands that correspond to the upcoming client requests. The ACT commands provided to the RQUE buffers 170a-170m may have higher priority than the ACT commands provided to the PQUE buffers 172a-172m (e.g., the ACT commands provided to the RQUE buffers 170a-170m may block a current CAS command and/or may be the nearest-future ACT command).

The timing circuits 178a-178j may be configured to maintain inter-bank specific timings (e.g., timing constraints defined by a particular design specification of the random access memory 54). In one example, one or more of the timing circuits 178a-178j may maintain a tRRD timing. In another example, one or more of the timing circuits 178a-178j may maintain a tPPD timing. The timing circuits 178a-178j may be configured to ensure that the ACT and/or PCHG requests may be pushed to downstream logic when ready. The number and/or types of inter-bank timing maintained by the timing circuits 178a-178j may be varied according to the design criteria of a particular implementation.

The bank set arbitration circuits 150a-150k may be configured to perform arbitration for the client requests in response to the client requests received from the bank set controllers 90a-90n. The bank set controllers 90a-90n and/or upstream logic (e.g., upstream from the bank set arbitration circuits 150a-150k) may be configured to generate signals (e.g., BDATA[A]-BDATA[K]). The signals BDATA[A]-BDATA[K] may comprise bank data. The signals BDATA[A]-BDATA[K] may be presented to a respective one of the bank circuits 160a-160k.

The bank data signals BDATA[A]-BDATA[K] may be generated by the upstream logic in response to client requests being pushed into the common request queue (RQUE) 102. The bank data signals BDATA[A]-BDATA[K] may be generated in response to client requests being pushed into the RQUE 102 to save order information for the client requests. In an example, the bank circuits (BQUE) 160a-160k may receive a respective one of the bank data signals BDATA[A]-BDATA[K] for every client request pushed into the RQUE 102 of the corresponding one of the dies 80a-80k. In an example, when the RQUE 102 of any of the bank set controllers 90a-90n of the memory die 80a receives a client request, the bank data signal BDATA[A] may be presented to the bank circuit 160a and the bank data may be enqueued into a first available location (e.g., an earliest location) in the bank circuit 160a. In another example, when the RQUE 102 of any of the bank set controllers 90a-90n of the memory die 80b receives a client request, the bank data signal BDATA[B] may be presented to the bank circuit 160b and the bank data may be enqueued into a first available location in the bank circuit 160b.

Since CAS requests must be serviced in order, the side band queue (e.g., the bank circuits 160a-160k) may store the bank data. The bank data stored by the bank circuits 160a-160k may be presented to the set arbitration logic 176. The bank circuits 160a-160k may present the bank data signals BDATA[A]-BDATA[K] to the set arbitration logic 176 of a respective one of the bank set arbitration circuits 150a-150k.

The bank data stored by the bank circuits 160a-160k may be used by the bank set arbitration circuits 150a-150k to ensure the order of the CAS requests is maintained. Once a request is pushed into the RQUE 102 for the same one of the memory dies 80a-80k, corresponding bank data (or bank information) may be pushed into the side band BQUE (e.g., the bank circuits 160a-160k). The set arbitration logic 176 within the bank set arbitration circuits 150a-150k may use the bank data from the bank circuits 160a-160k to ensure that the CAS requests may be generated (e.g., as the signal ASC) with the same order as the original client requests (e.g., the signal CAS). Details of the storage of the bank information in the bank circuits 160a-160k may be described in association with FIG. 6.

The inter-bank specific timings (e.g., tRRD, tPPD, etc.) may be accounted for in the bank set arbitration circuits 150a-150k by the timing circuits 178a-178j to guarantee that activate and precharge requests may be pushed to downstream logic when ready. The ACT requests from the RQUE buffers 170a-170m (e.g., activate commands from current client requests) and ACT requests from the PQUE buffers 172a-172m (e.g., activate commands from upcoming client requests) may be arbitrated by the set arbitration logic 176 providing highest priority to the ACT requests from current client requests (e.g., from the RQUE buffers 170a-170m).

The die arbitration circuit 152 may comprise blocks (or circuits) 180a-180n, blocks (or circuits) 182a-182n, a block (or circuit) 184, a block (or circuit) 186 and/or blocks (or circuits) 188a-188i. The circuits 180a-180n may comprise CAS buffers. The circuits 182a-182n may comprise non-CAS buffers. The circuit 184 may implement a multiplexer. The circuit 186 may implement a die arbitration logic. The circuits 188a-188i may implement timers. The die arbitration circuit 152 may comprise other components (not shown). The number, type and/or arrangement of the components of the die arbitration circuits 152 may be varied according to the design criteria of a particular implementation.

The arbitrated CAS requests (e.g., the signal ASC) may be received by the CAS buffers 180a-180n in the final stage of arbitration (e.g., the die arbitration circuit 152). The arbitrated non-CAS requests such as activate and precharge requests (e.g., the signal AFC) may be received by the non-CAS queue 182a-182n in the final stage of arbitration. In an example, the number of CAS buffers 180a-180n and/or the number of non-CAS buffers 182a-182n may vary based on the number of bank set arbitration circuits 150a-150k implemented by the hierarchical arbitration logic 100.

The multiplexer 184 may be configured to receive the CAS commands for the current client requests. The CAS buffers 180a-180n may present the CAS requests to the multiplexer 184. The multiplexer 184 may present the CAS requests to the die arbitration logic 186 and/or the physical interface 62.

The die arbitration logic 186 may be configured to arbitrate commands from the dies 80a-80k. The die arbitration logic 186 may be configured to receive the CAS commands, the ACT commands from the current client requests, the ACT commands for upcoming client requests and/or the PCHG commands for upcoming client requests. The CAS commands, the ACT commands from the current client requests, the ACT commands for upcoming client requests and/or the PCHG commands for upcoming client requests may have been previously arbitrated by the set arbitration logic 176 upstream. The CAS buffers 180a-180n may present the arbitrated CAS commands from the current client requests to the die arbitration logic 186. The non-CAS buffers 182a-182n may present the ACT commands for current client requests, the ACT commands and/or the PCHG commands for upcoming client requests to the die arbitration logic 186. The die arbitration logic 186 may present the commands to the physical interface 62. The die arbitration logic 176 may arbitrate the CAS commands, the ACT commands and/or PCHG commands according to a priority.

The timing circuits 188a-188i may be configured to maintain die specific timings (e.g., timing constraints defined by a particular design specification of the random access memory 54). In one example, one or more of the timing circuits 188a-188i may determine command readiness according to Cas to Cas Delay (e.g., CCD), read to write turn around (e.g., RTW) and/or write to read turn around (e.g., WTR). In another example, one or more of the timing circuits 188a-188i may maintain a tCCD timing. In yet another example, one or more of the timing circuits 188a-188i may maintain a timing requirement between two sub-commands such as tAAD (e.g., activate 1 to activate 2 command delay). The number and/or types of die specific timings maintained by the timing circuits 188a-188i may be varied according to the design criteria of a particular implementation.

The die arbitration circuit 152 may operate as a final stage of the hierarchical arbitration logic 100. The die arbitration circuit 152 may be decoupled from other arbitration stages (e.g., the bank set arbitration circuits 150a-150k and the bank set controllers 90a-90n). The die arbitration circuit 152 may be configured to perform arbitration for the client requests in response to the arbitrated client requests received from the bank set arbitration circuits 150a-150k. The bank set controllers 90a-90n and/or upstream logic (e.g., upstream from the die arbitration circuit 152) may be configured to generate a signal (e.g., DDATA). The signal DDATA may comprise die data. The signal DDATA may be presented to the die-bank circuit 162.

The die data signal DDATA may be generated by the upstream logic in response to client requests being pushed into the common request queue (RQUE) 102. The die data signal DDATA may be generated in response to client requests being pushed into the RQUE 102 to save order information for the client requests. In an example, the die-bank circuit (DQUE) 162 may receive the die data signal DDATA for every client request pushed into any of the RQUE 102 of any of the bank set controllers 90a-90n for any of the dies 80a-80k. In an example, when the RQUE 102 of any of the bank set controllers 90a-90n of the memory die 80a receives a client request, the die data signal DDATA may be presented to the die-bank circuit 162 and the die data may be enqueued into a first available (e.g., earliest) location in the die-bank circuit 162. In another example, when the RQUE 102 of any of the bank set controllers 90a-90n of the memory die 80b receives a client request, the die data signal DDATA may be presented to the die-bank circuit 162 and the die data may be enqueued into a first available location in the die-bank circuit 162.

Since CAS requests must be serviced in order, the side band queue (e.g., the die-bank circuit 162) may store the die data. The die data stored by the die-bank circuit 162 may be presented to the die arbitration logic 186. The die-bank circuit 162 may present the die data signal DDATA to the die arbitration logic 186 of the die arbitration circuit 152.

The arbitrated CAS requests received from the bank set arbitration circuits 150a-150k may comprise CAS requests per die (e.g., the signal ASC) and a non-CAS requests queue per die (e.g., the signal AFC). In order to maintain the CAS requests ordering, the side band die information DDATA may be pushed into the DQUE (e.g., the die-bank circuit 162). The die data stored by the die-bank circuit 162 may be used by the die arbitration circuit 152 to ensure that the order of the CAS requests is maintained.

Once a request is pushed into the RQUE 102 for any of the memory dies 80a-80k, corresponding die data (or die information) may be pushed into the side band DQUE (e.g., the die-bank circuit 162). The die arbitration logic 186 within the die arbitration circuit 152 may use the die data from the die-bank circuit 162 to ensure that the CAS requests from the current die only may be granted. The die arbitration logic 186 may be configured to arbitrate the non-CAS commands (e.g., the signal AFC) from all of the memory dies 80a-80k sent to the physical interface 62 as command slots are available. A priority to non-CAS command from the current one of the memory dies 80a-80k may be preferred. The die-bank circuit 162 may enable the CAS to CAS delay command timing to be ensured. The CAS command from the current die (e.g., determined based on the top entry of the die-bank circuit 162) may be at a highest priority if the CAS command is ready. Details of the storage of the die information in the die-bank circuit 162 may be described in association with FIG. 6.

The die arbitration circuit 152 may be configured to determine command readiness. The command readiness may be checked when all related timing such as CCD, RTW, or WTR are met. Non-CAS command timing may be guaranteed from the arbitration performed in the bank set arbitration circuits 150a-150k. Since the non-CAS command timing has been previously maintained, the non-CAS commands may be guaranteed from previous blocks so these commands may be performed (e.g., drained from the non-CAS buffers 182a-182m) without any additional checks by the die arbitration circuit 152.

The non-CAS commands may comprise more than one command cycle. Since the non-CAS commands may comprise more than one cycle, the non-CAS commands may be split into sub commands. The sub commands may be arbitrated with the rest of the commands. In one example, an ACT command may be split into two sub commands (e.g., ACTIVE1 and ACTIVE2). The die arbitration logic 186 may select a pending sub command as having higher priority over other non-CAS commands to meet timing requirement between two sub commands tAAD (e.g., activate 1 to activate 2 command delay).

The die arbitration logic 186 may arbitrate the commands based on a priority. One example priority for the die arbitration logic 186 may select the CAS commands (if ready) from the current die as the highest priority. A next highest priority command may be any pending sub command from an earlier non-CAS command (e.g., perform the sub-command ACTIVE2 after the sub-command ACTIVE1 is performed unless there is a pending CAS command for the current die). A next highest priority for the die arbitration logic 186 may be a non-CAS command from the current die. The lowest priority commands selected by the die arbitration logic 186 may be non-CAS commands from other dies. In an example, if there are more than two dies, the die arbitration logic 186 may perform a round-robin among non-current dies.

CAS commands may only be issued for the current die and/or current bank set specified by the side band logic (e.g., the bank circuits 160a-160k and/or the die-bank circuit 162). The side band logic may ensure that the same order as the client requests is maintained. CAS requests from the other dies or bank-sets may be masked.

The hierarchical arbitration logic 100 may be configured to enable the memory controller 60 to sustain a data transfer rate for the random access memory 54 while meeting timing requirements for the random access memory 54. The sideband ordering queue comprising the BQUE circuits 160a-160k and the DQUE 162 may enable the functionality of the hierarchical arbitration logic 100.

The sideband ordering queue may be configured to keep the order information for the client requests. With the sideband ordering queue keeping the order information for the client requests, the arbitration stages (e.g., the arbitration performed by the arbitration logic 112 of the bank set controllers 90a-90n, the arbitration performed by the set arbitration logic 176 of the bank set arbitration circuits 150a-150k and/or the arbitration performed by the die arbitration logic 186 of the die arbitration circuit 152) may be decoupled and/or pipelined. The pipelining of the arbitration stages may be enabled by peeking ahead at upcoming commands stored in the sideband ordering queue and generating an efficient command order. The pipelining of the arbitration stages may enable the hierarchical arbitration logic 100 to utilize the available bandwidth for transferring data to/from the memory 54.

The sideband ordering queue may be configured to keep the order information for the client requests and prioritize the commands for near-future ACT/PCHG commands over far-future ACT/PCHG. The near-future ACT/PCHG commands may be determined based on which of the ACT/PCHG commands correspond to a current bank set controller for the next CAS command. The set arbitration logic 176 and/or the die arbitration logic 186 may be configured to analyze upcoming commands by peeking ahead at the bank data enqueued in the BQUE circuits 160a-160k and/or the die data enqueued in the die-bank circuit 162.

The order information determined by peeking at the bank data and/or die data may be used to generate a command sequence that implements efficient page management (e.g., an optimal command sequence). In an example, higher priority may be given to the ACT/PCHG commands of a current one of the bank set controllers 90a-90n that corresponds to the next CAS command over ACT/PCHG commands of the bank-set controllers 90a-90n that do not correspond to the next CAS command. Efficient page management may be enabled by closing/opening a page in advance for a future request in order to overlap with timing constraints (e.g., a tRCD timing and/or a tRP timing). By performing efficient page management, scenarios where the memory controller 60 may wait to issue a CAS command may be reduced or eliminated (e.g., the ACT/PCHG commands may be provided in advance to ensure that the appropriate pages are closed and opened to ensure that the random access memory 54 is ready when the CAS command is to be performed).

Figure 6:
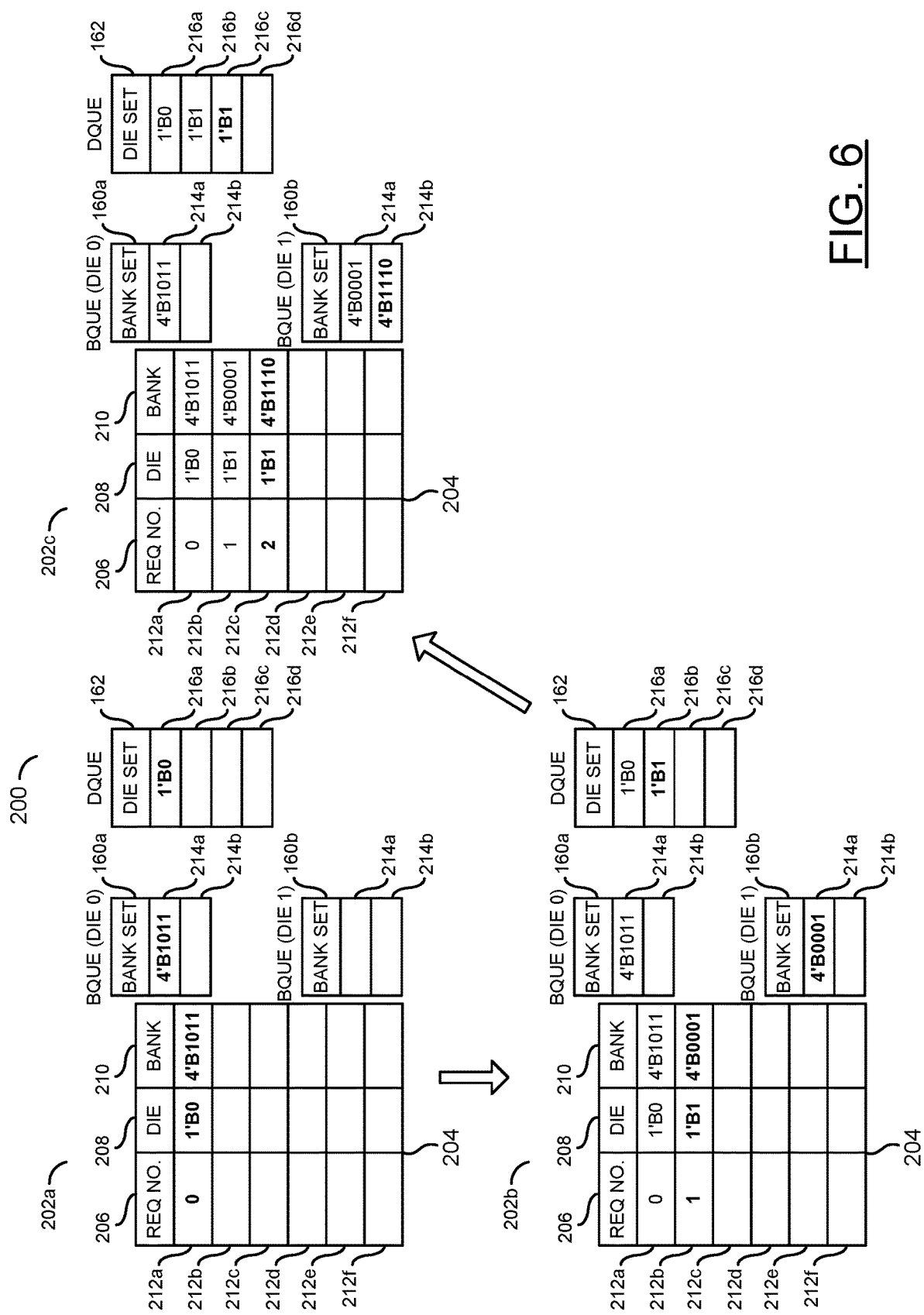
FIG. 6 is a diagram illustrating data stored for a client request buffering scheme in a bank circuit and a die-bank circuit.

Referring to FIG. 6, a diagram illustrating data stored for a client request buffering scheme in a bank circuit and a die-bank circuit is shown. A request buffering example 200 is shown. The request buffering example 200 may illustrate enqueuing the bank circuits 160a-160k and/or the die-bank circuit 162 in response to client requests. Enqueuing the BQUE and/or the DQUE circuits may ensure that in every single arbitration stage the client request order for CAS commands may be maintained. Ensuring that the client request order is maintained may enable the arbitration stages of the hierarchical arbitration logic 100 to be decoupled and/or pipelined. The enqueue activity may be performed in request to a client request being received at upstream logic, which may be prior to the client requests being stored in the input buffers of the bank set arbitration circuits 150a-150k and/or the die arbitration circuit 152.

A bank switch may occur when the client request received comprises a request for one of the memory banks 84a-84m that is different than the previously received client request. A die switch may occur when the client request received comprises a request for one of the memory dies 80a-80k that is different than the previously received client request. Bank switches and die switches may affect an amount of time for client requests to be handled by the memory controller 60. In an example, a bandwidth of the data transfer may be higher if multiple commands may be performed to a same die and/or same one of the memory banks 84a-84m. The hierarchical arbitration logic 100 may be configured to generate the optimal command sequence to enable take advantage of banks and/or dies that are currently open to increase an overall bandwidth.

The request buffering example 200 may comprise a sequence of examples 202a-202c. The sequence of examples 202a-202c may illustrate the status of the bank circuits 160a-160k and the die-bank circuit 162 after a series of client requests has been received. The bank circuits 160a-160b and the die-bank circuit 162 shown in the sequence of examples 202a-202c may be an illustrative example of the bank circuits 160a-160k and the die-bank circuit 162 in the hierarchical arbitration logic 100 shown in association with FIG. 5. The sequence of examples 202a-202c may be shown in chronological order. For example, the example 202a may be the earliest example in the sequence of examples 202a-202c, then the example 202b may be shown after a next client request is received, and then the example 202c may be shown after a last client request is received.

A table 204 in each of the sequence of examples 202a-202c is shown as a visualization of the incoming client requests received upstream. The table 204 may comprise a number of columns 206-210. The column 206 may represent a request number (e.g., to indicate an order of the requests). The column 208 may represent die information for the client requests. In the example shown, the die information may comprise a one bit value. For example, two of the memory dies 80a-80b may be implemented by the memory 54 (e.g., a logical '0' may correspond to client requests for the memory die 80a and a logical '1' may correspond to client requests for the memory die 80b). The column 210 may represent bank information for the client requests. In the example shown, the bank information of the client requests may comprise a four-bit value. For example, each of the memory dies 80a-80b may comprise the sixteen memory banks 84a-84p.

The table 204 may comprise rows 212a-212f. The rows 212a-212f may each comprise a client request received by the hierarchical arbitration logic 100. In the example shown, the table 204 may comprise six rows 212a-212f. However, the hierarchical arbitration logic 100 may service any number of client requests (e.g., client requests 212a-212n). Each of the client requests 212a-212f may comprise the die data 208 and the bank data 210. The client requests 212a-212f may represent client requests received by the RQUE circuits 102 in the bank set controllers 90a-90n that correspond to any of the memory dies 80a-80k.

The bank circuits 160a-160b in each of the sequence of examples 202a-202c may each be represented as a table of values that provides a visualization of the data stored in the individual bank circuits 160a-160b in response to the client requests. The bank circuit 160a may correspond to the memory die 80a (e.g., die 0). For example, the bank circuit 160a may store values that correspond to the bank data for the memory die 80a. The bank circuit 160b may correspond to the memory die 80b (e.g., die 1). For example, the bank circuit 160b may store values that correspond to the bank data for the memory die 80b.

The tables representing the bank circuits 160a-160b may each comprise a number of rows 214a-214b. Each of the rows 214a-214b may represent a storage location for the bank circuit 160a-160b. The rows 214a-214b may represent a depth of the bank circuits 160a-160b. Each of the rows 214a-214b may represent a storage location in the first in first out bank circuits 160a-160b that may store bank data representing a single client request. In the example shown, the depth of each of the bank circuits 160a-160b may be two. Generally, the depth of each of the bank circuits 160a-160n may be selected to be large enough to hold the bank information for all client requests in the pipeline for the arbitration stages (e.g., to prevent a bottleneck). The depth of each of the bank circuits 160a-160b may be varied according to the design criteria of a particular implementation.

The rows 214a-214b may store the bank data in a first in first out order. For example, the row 214a may store the address corresponding to bank data from a client request that occurred at the earliest time (e.g., the row 214a may be an earlier position for a client request and the row 214b may be a later position for a client request). For every client request received by the RQUE 102 of one of the bank set controllers 90a-90n for a corresponding one of the memory dies 80a-80k, bank data may be pushed by upstream logic into a corresponding one of the bank circuits 160a-160b. For example, if the one client request was to B<0> of D<0>, then the bank data may be pushed into the bank circuit 160a and if the next request is to B<2> of D<1>, then the bank data corresponding to current client request may be pushed into the bank circuit 160b. As the bank data is popped off the bank circuits 160a-160b, the bank data that was received at the next earliest time may become the top of the stack (e.g., after the bank data stored in the location 214a is popped off (e.g., dequeued), the bank data stored in the location 214b may be moved up to the storage location 214a representing the earliest bank data).

The bank circuits 160a-160b may store the bank-set information and/or bank ID information. In some embodiments, the bank-set information and/or the bank ID information may be any part of the bank data of the client requests. In the example shown, the bank data 210 of the client requests may be four bits of information. The bank circuits 160a-160b may store two bits of information from the bank data 210 that correspond to the bank-set data and two bits of information from the bank data 210 that corresponds to the bank ID information. In the example shown, the bank-set data stored in the locations 214a-214b may correspond to the least-significant bits of the bank data and the bank ID information in the locations 214a-214b may correspond to the most-significant bits of the bank data. Other combinations of bits from the bank data 210 may comprise the bank-set information and/or the bank ID information. Both row information and bank information may be parts of the address of the client requests 212a-212f. The bank ID information may be used to decide if a top entry of the PQUE buffers 172a-172m is the ACT/PCHG command for the next CAS command of a bank-set. The hierarchical arbitration logic 100 may select the ACT/PCHG command for the same bank-set as the next CAS command as the highest priority. The number of bits for the bank-set information and/or the number of bits for the bank ID information may depend on the number of memory banks 84a-84m in each bank set and/or the number of bank sets 82a-82n implemented by the memory 54.

The die-bank circuit 162 in each of the sequence of examples 202a-202c may be represented as a table of values that provides a visualization of the data stored in the die-bank circuit 162 in response to the client requests. The table representing the die-bank circuit 162 may comprise a number of rows 216a-216d. Each of the rows 216a-216d may represent a storage location for the die-bank circuit 162. The rows 216a-216d may represent a depth of the die-bank circuit 162. Each of the rows 216a-216d may represent a storage location in the first in first out die-bank circuit 162 that may store die data for a single client request. In the example shown, the depth of the die-bank circuit 162 may be four. Generally, the depth of the die-bank circuit 162 may be selected to be large enough to hold the die information for all client requests in the pipeline for the arbitration stages (e.g., to prevent a bottleneck). There may not need to be a size relationship between the depth of the bank circuits 160a-160k and the die-bank circuit 162 (e.g., each circuit of the sideband ordering queue may be sized independently). In an example, since the die-bank circuit 162 may enqueue the die information for each client request received by any RQUE circuit 102 regardless of the memory die 80a-80k, the die-bank circuit 162 may fill up faster than any individual one of the bank circuits 160a-160k (e.g., the die-bank circuit 162 may be larger than any one of the bank circuits 160a-160k to accommodate the greater number of die information stored). The number of storage locations for the die-bank circuit 162 may be varied according to the design criteria of a particular implementation.

The address locations 216a-216d may store the die data in a first in first out order. For example, the storage location 216a may store the die data that occurred at the earliest time (e.g., the row 216a may be an earlier position for a client request and the row 216b may be a later position for a client request). In response to each client request received by any of the RQUE circuits 102 corresponding to any of the memory dies 80a-80k, the die data may be pushed by the upstream logic into a next available one of the rows 216a-216d. As the die data is popped off the die-bank circuit 162, the die data that was received at the next earliest time may become the top of the stack (e.g., after the die data stored in the location 216a is popped off (e.g., dequeued), the die data stored in the location 216b may be moved up to the storage location 216a representing the earliest die data). In the example shown, the die data may comprise the one-bit of data of the die data 208 in the client requests 212a-212f. The number of bits stored by the storage locations 216a-216d for the die data may depend on the number of memory dies 80a-80k implemented by the memory 54.

The first example sequence 202a is shown comprising a first client request 212a. The first client request 212a may comprise the die data 208 of 1'B0 (e.g., a one-bit value representing die 0). The first client request 212a may comprise the bank data 210 of 4'B1011 (e.g., a four-bit value representing bank 3 and/or bank-set 2). Since the client request 212a corresponds to the memory die 80a (e.g., received by one of the RQUE circuits 102 of die 0), the bank-set data and the bank ID may be pushed into the bank circuit 160a that corresponds to the memory die 80a. The bank-set information and the bank ID may be pushed into the first (e.g., earliest) available location in the bank circuit 160a. Since the client request 212a may be the first client request, the bank-set information and the bank ID may be pushed to the storage location 214a of the bank circuit 160a. The bank-set information and the bank ID 214a may comprise the four-bit value 4'B1011 (e.g., the two LSB of the bank data 210 for the bank ID and the two MSB of the bank data 210 for the bank-set information). The die data 208 may be pushed to the first (e.g., earliest) available location in the die-bank circuit 162. The die data 216a may comprise the one-bit value 1'B0 (e.g., the die data 208).

The second example sequence 202b, may comprise a second client request 212b. The second client request 212b may comprise the die data 208 of 1'B1 (e.g., a one-bit value representing die switch to die 1). The second client request 212b may comprise the bank data 210 of 4'B0001 (e.g., a four-bit value representing bank 1 and bank-set 0). Since the client request 212b corresponds to the memory die 80b (e.g., received by one of the RQUE circuits 102 of die 1), the bank-set data and the bank ID may be pushed into the bank circuit 160b that corresponds to the memory die 80b. The bank-set information and the bank ID may be pushed into the first (e.g., earliest) available location in the bank circuit 160b. Since the client request 212b may be the first client request comprising bank data to be pushed to the bank circuit 160b, the bank-set information and the bank ID may be pushed to the storage location 214a of the bank circuit 160b. The bank-set information and the bank ID 214a may comprise the four-bit value 4'B0001 (e.g., the two LSB of the bank data 210 for the bank ID and the two MSB of the bank data 210 for the bank-set information). The die data 208 may be pushed to the next available (e.g., earliest) location in the die-bank circuit 162. The die data 216b may comprise the one-bit value 1'B1 (e.g., the die data 208).

The third example sequence 202c, may comprise a third client request 212c. The third client request 212c may comprise the die data 208 of 1'B1 (e.g., a one-bit value representing a consecutive request to die 1). The third client request 212c may comprise the bank data 210 of 4'B1110 (e.g., a four-bit value representing bank 2 and bank-set 3). Since the client request 212c corresponds to the memory die 80b (e.g., received by one of the RQUE circuits 102 of die 1), the bank-set data and the bank ID may be pushed into the bank circuit 160b that corresponds to the memory die 80b. The bank-set information and the bank ID may be pushed into the first available (e.g., earliest) location in the bank circuit 160b. Since the client request 212c may be the second client request comprising data to be pushed to the bank circuit 160b, the bank-set information and the bank ID may be pushed to the storage location 214b (e.g., the next earliest available) of the bank circuit 160b. The bank-set information and bank ID 214b may comprise the four-bit value 4'B1110 (e.g., the two LSB of the bank data 210 for the bank ID and the two MSB of the bank data 210 for the bank-set information). The die data 208 may be pushed to the next available (e.g., earliest) location in the die-bank circuit 162. The die data 216c may comprise the one-bit value 1'B1 (e.g., the die data 208).

The hierarchical arbitration logic 100 may be configured to generate an efficient (e.g., optimal) sequence for the commands. The efficient sequence may be generated to open/close pages for future requests in advance in order to overlap with timing data (e.g., tRCD/tRP). The efficient sequence may be generated for efficient page management to prevent waiting to perform any ACT/PCHG commands when one of the CAS commands is to be issued.

The efficient sequence generated by the hierarchical arbitration logic 100 may prioritize near-future commands over far-future commands. The near-future commands may comprise commands that correspond to the client requests that were pushed into the sideband queue (e.g., the bank circuits 160a-160k and/or the die-bank circuit 162) at an earlier time than the far-future commands. In an example, since the bank data stored in the bank circuits 160a-160k and the die data stored in the die-bank circuit 162 are stored in a stack by chronological order that the client requests were received, the client requests that were received at an earlier time may be the commands stored in the top locations (e.g., the row 214a may be an earlier command than the row 214b for the bank circuits 160a-160k and the row 216a may be an earlier command than the row 216b for the die-bank circuit 162). Since the sideband queue provides first-in first-out storage, the earliest command may be popped off when the command is executed and the next command at the top of the stack may become the earliest command. The CAS commands for the earlier commands (e.g., near-future commands at the top and/or higher levels of the queue) may be sent by the set arbitration logic 176 and/or the die arbitration logic 186 before the commands received at a later time (e.g., far-future commands at the lower levels of the queue).

The set arbitration logic 176 and/or the die arbitration logic 186 may be configured to peek at the bank data and/or the die data stored in the bank circuits 160a-160n and/or the die-bank circuit 162 (e.g., the signals BDATA[A]-BDATA [K] and/or the signal DDATA). The set arbitration logic 176 may peek at the bank-set ID stored in the rows 214a-214b of the bank circuits 160a-160k. The bank-set information enqueued may enable the set arbitration logic 176 to automatically determine a priority for each of the bank sets 82a-82n. The bank ID enqueued may enable the set arbitration logic 176 to determine whether a top entry of the PQUE buffers 172a-172m comprises a ACT or PCHG command for the next CAS of the bank set. The set arbitration logic 176 may select commands that comprise the ACT/PCHG command for the next CAS of the bank set as the highest priority commands in the efficient command sequence.

By selecting the ACT/PCHG commands for the next CAS command of the current bank set, the timing data may be calculated as soon as possible. The timing data calculated may comprise tRAS, tRP, tRRD, etc. The CAS command for highest priority commands may be sent earlier.

Figure 7:
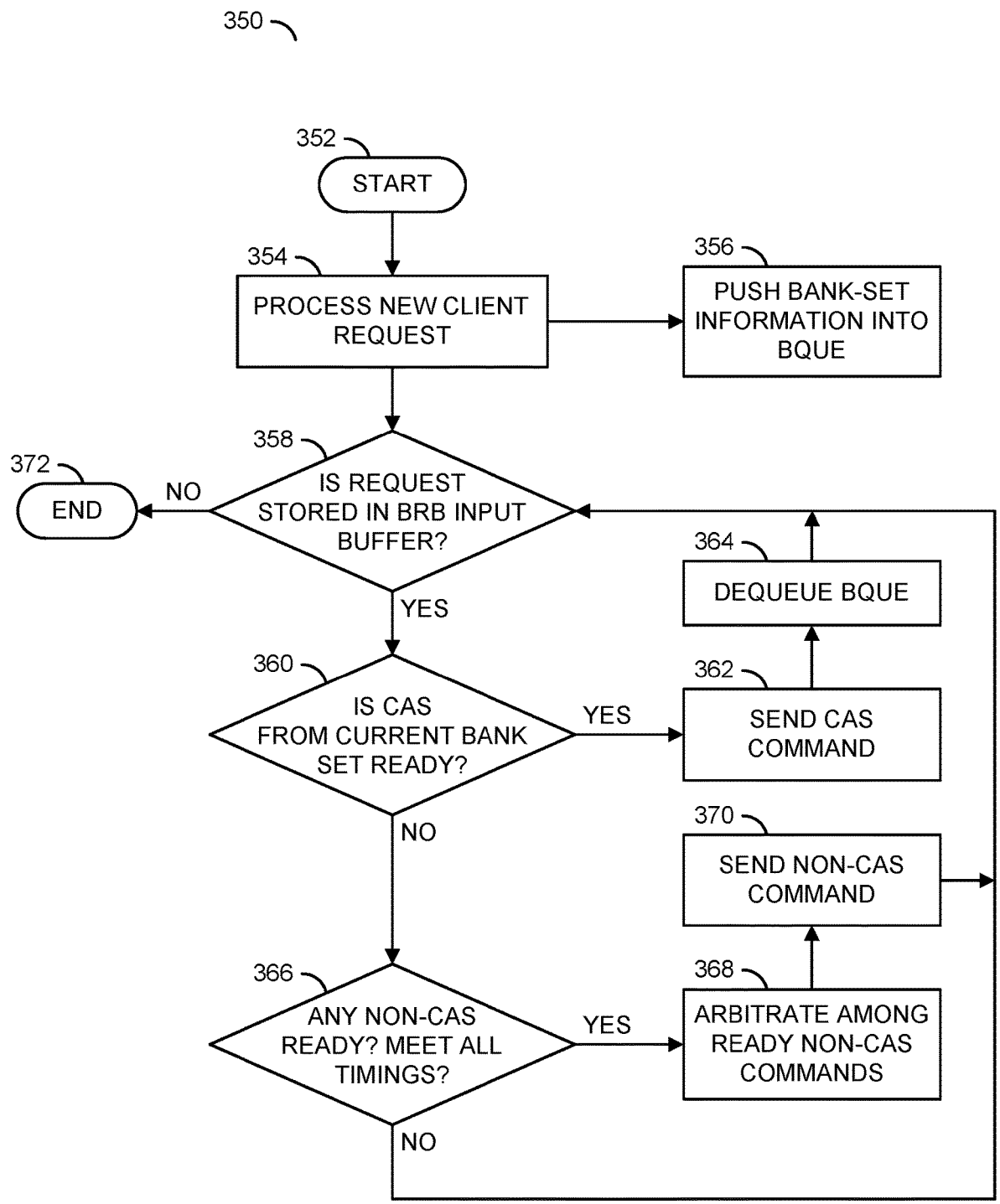
FIG. 7 is a flow diagram illustrating a method for generating commands in response to bank-set arbitration.

Referring to FIG. 7, a method (or process) 350 is shown. The method 350 may generate commands in response to bank-set arbitration. The method 350 generally comprises a step (or state) 352, a step (or state) 354, a step (or state) 356, a decision step (or state) 358, a decision step (or state) 360, a step (or state) 362, a step (or state) 364, a decision step (or state) 366, a step (or state) 368, a step (or state) 370, and a step (or state) 372.

The step 352 may start the method 350. In the step 354, the bank set arbitration circuits 150a-150k may process a new one of the client requests 212a-212n. In an example, the client requests 212a-212n may comprise the commands CAS/ACT from the RQUE circuit 102 and/or the commands ACT/PCHG from the PQUE circuits 104a-104m received by the bank set arbitration circuits 150a-150k from the bank set controllers 90a-90n. Next, the method 350 may move to the step 356 and the decision step 358. The step 356 and the decision step 358 may be performed in parallel. In the step 356, the logic upstream from the bank set arbitration circuits 150a-150k may push the bank-set information and the bank ID from the bank data 210 (from one of the client request 212a-212n) into the bank circuit 160a-160k that corresponds to the die of the client request.

In the decision step 358, the bank set arbitration circuits 150a-150k may determine whether there is a client request is stored in the input buffer. In an example, the input buffer may be one of the RQUE input buffers 170a-170m (for CAS requests or current ACT commands) or one of the PQUE input buffers 172a-172m (for upcoming ACT or PCHG commands). If there is a client request is stored in one of the input buffers, then the method 350 may move to the decision step 360.

In the decision step 360, the bank set arbitration circuits 150a-150k may determine whether the CAS command from the current bank set is ready. The bank set arbitration circuits 150a-150k may determine whether the CAS command from the current bank set is ready based on the timing circuits 178a-178j and/or the bank data stored in the bank circuits 160a-160k. If the CAS command from the current bank set is ready, then the method 350 may move to the step 362. In the step 362, the bank set arbitration circuits 150a-150k (e.g., the multiplexer 174) may send the arbitrated CAS command to the die arbitration circuit 152 (e.g., the signal ASC). In the step 364, one of the bank circuits 160a-160k may dequeue the bank data. For example, the bank data 214a may be popped off the stack and the bank data 214b may be moved up to the bank-set information 214a at the top of the stack to become the nearest future command (and any subsequent bank-set information 214c-214n may be moved up). Next, the method 350 may return to the decision step 358.

In the decision step 360, if the CAS command from the current bank set is not ready, then the method 350 may move to the decision step 366. In the decision step 366, the set arbitration logic 176 may determine whether any non-CAS commands are ready and/or whether all timings have been met. The timings may be determined to be met based on the timing circuits 178a-178j. If a non-CAS command is not ready and/or the timings have not been met, then the method 350 may return to the decision step 358. If a non-CAS command is ready and the timings have been met, then the method 350 may move to the step 368.

In the step 368, the set arbitration logic 176 may perform arbitration among the ready non-CAS commands. The arbitration of the non-CAS commands may be performed according to the priority. In some embodiments, a round-robin arbitration may be performed. Next, in the step 370, the bank set arbitration circuits 150a-150k may send the non-CAS command. For example, the set arbitration logic 176 may send the non-CAS command to the die arbitration circuit 152 as the signal AFC. Next, the method 350 may return to the decision step 358.

In the decision step 358, if there are not any client requests stored in the input buffers of the bank set arbitration circuits 150a-150k, then the method 350 may move to the step 372. The step 372 may end the method 350.

Figure 8:
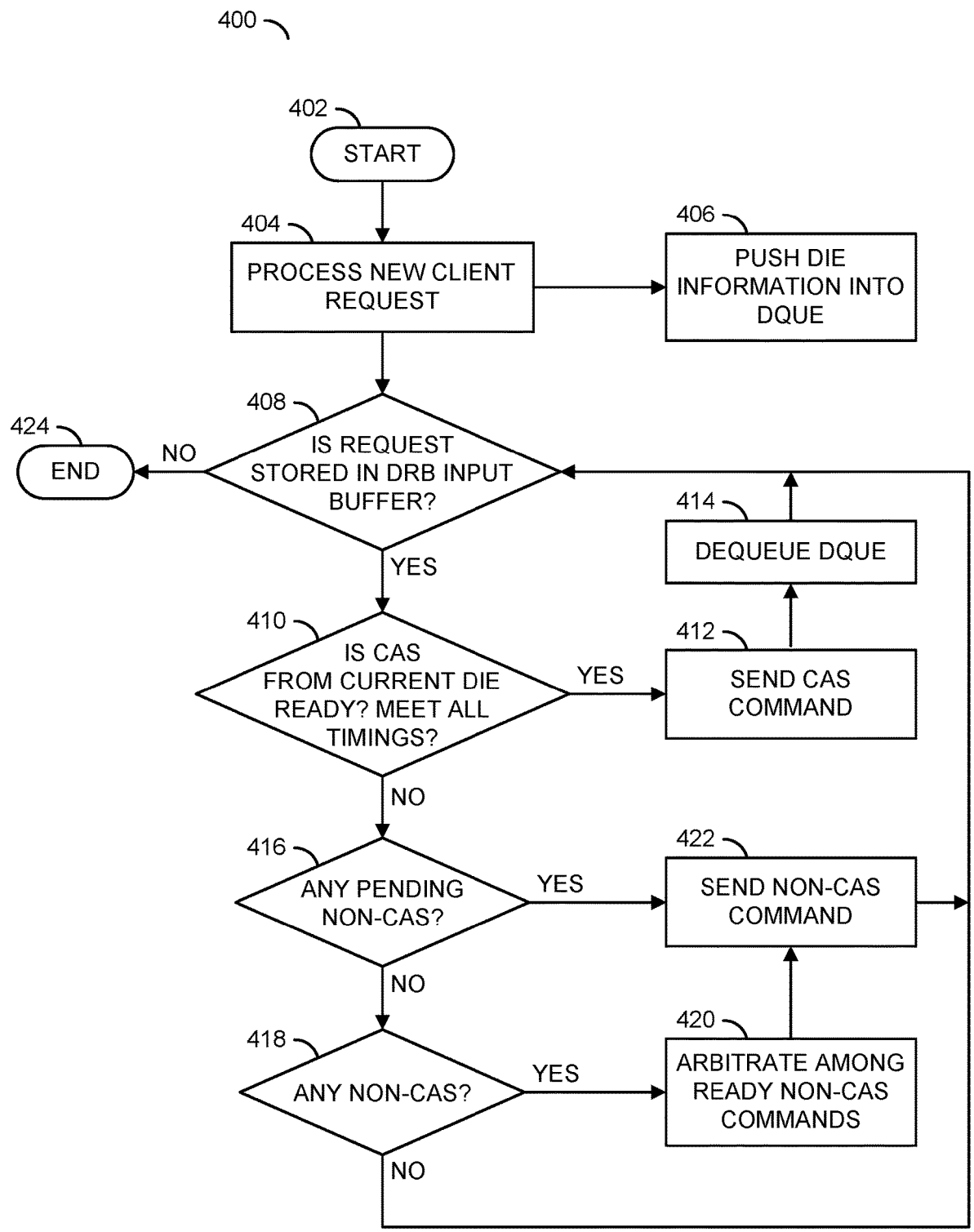
FIG. 8 is a flow diagram illustrating a method for generating commands in response to die arbitration.

Referring to FIG. 8, a method (or process) 400 is shown. The method 400 may generate commands in response to die arbitration. The method 400 generally comprises a step (or state) 402, a step (or state) 404, a step (or state) 406, a decision step (or state) 408, a decision step (or state) 410, a step (or state) 412, a step (or state) 414, a decision step (or state) 416, a decision step (or state) 418, a step (or state) 420, a step (or state) 422, and a step (or state) 424.

The step 402 may start the method 400. In the step 404, the die arbitration circuit 152 may process a new one of the client requests 212a-212n. In an example, the client requests for the die arbitration circuit 152 may be one of the arbitrated commands AFC and/or ASC received from the bank set arbitration circuits 150a-150k. Next, the method 400 may move to the step 406 and the decision step 408. The step 406 and the decision step 408 may be performed in parallel. In the step 406, the die arbitration circuit 152 may push the die information from the die data 208 (from one of the client request 212a-212n) into the die-bank circuit 162.

In the decision step 408, the die arbitration circuit 152 may determine whether the client request is stored in the input buffer. In an example, the input buffer may be one of the CAS input buffers 180a-180n (for CAS requests) or one of the non-CAS input buffers 182a-182n (for ACT or PCHG commands). If there is a client request is stored in one of the input buffers, then the method 400 may move to the decision step 410.

In the decision step 410, the die arbitration circuit 152 may determine whether the CAS command from the current die is ready and whether all of the timings have been met. The die arbitration circuit 152 may determine whether the CAS command from the current die is ready based on the timing circuits 188a-188i and/or the die information stored in the die-bank circuit 162. If the CAS command from the current die is ready, then the method 400 may move to the step 412. In the step 412, the die arbitration circuit 152 (e.g., the multiplexer 184) may send the arbitrated CAS command to the physical interface 62. In the step 414, die-bank circuit 162 may dequeue the die information. For example, the die information 216a may be popped off the stack and the die information 216b may be moved up to the die information 216a at the top of the stack to become the nearest future command (and any subsequent die information 216c-216n may be moved up). Next, the method 400 may return to the decision step 408.

In the decision step 410, if the CAS command from the current die is not ready and/or the timings have not been met, then the method 400 may move to the decision step 416. In the decision step 416, the die arbitration logic 186 may determine whether there are any pending non-CAS sub-commands. For example, the pending sub-command may be a second part of a non-CAS command that has been split over multiple clock cycles. If there is a pending non-CAS sub-command, then the method 400 may move to the step 422. If there is not a pending non-CAS sub-command, then the method 400 may move to the decision step 418. In the decision step 418, the die arbitration logic 186 may determine if there are any non-CAS commands. In an example, the decision step 416 and the decision step 418 may implement the priority for the die arbitration circuit 152 for the non-CAS commands when there are no more CAS commands for the current die.

In the decision step 418, if there are not any non-CAS commands, then the method 400 may return to the decision step 408. In the decision step 418, if there are any non-CAS commands, then the method 400 may move to the step 420. In the step 420, the die arbitration logic 186 may perform arbitration among the ready non-CAS commands. The arbitration of the non-CAS commands may be performed according to the priority. In some embodiments, a round-robin arbitration may be performed among non-CAS commands for other of the memory dies 80a-80k. Next, in the step 422, the die arbitration circuit 152 may send the non-CAS command. For example, the die arbitration logic 186 may send the non-CAS command to the physical interface 62. Next, the method 400 may return to the decision step 408.

In the decision step 408, if there are not any client requests stored in the input buffers of the die arbitration circuit 152, then the method 400 may move to the step 424. The step 424 may end the method 400.

Figure 9:
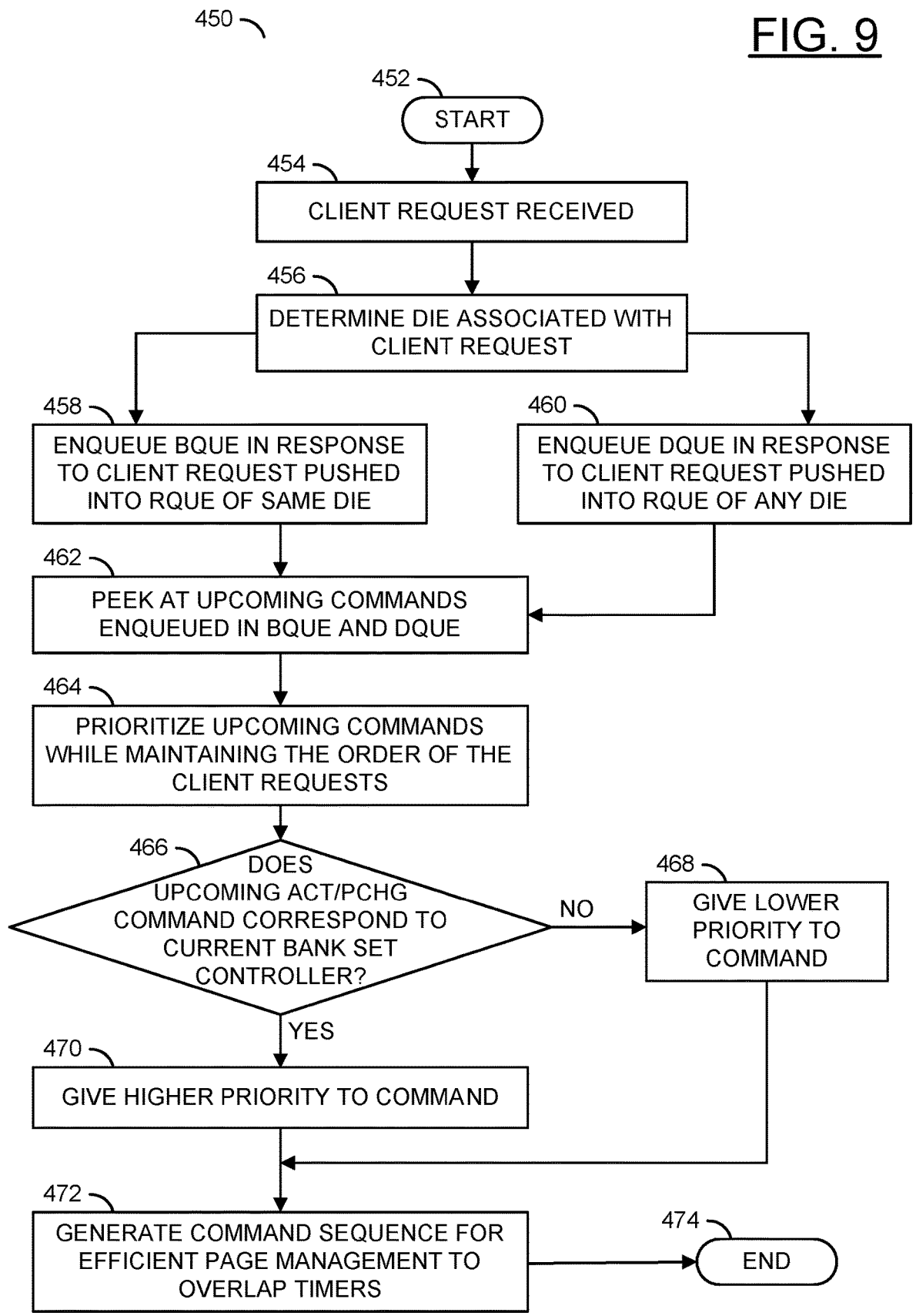
FIG. 9 is a flow diagram illustrating a method for generating a command sequence for efficient page management.

Referring to FIG. 9, a method (or process) 450 is shown. The method 450 may generate a command sequence for efficient page management. The method 450 generally comprises a step (or state) 452, a step (or state) 454, a step (or state) 456, a step (or state) 458, a step (or state) 460, a step (or state) 462, a step (or state) 464, a decision step (or state) 466, a step (or state) 468, a step (or state) 470, a step (or state) 472, and a step (or state) 474.

The step 452 may start the method 450. In the step 454, client requests may be received by the bank-set controllers 90a-90n. For example, the client requests may be enqueued in the RQUE circuit 102 of the bank-set controllers 90a-90n. In the step 456, the logic upstream from the bank set arbitration circuits 150a-150k and/or the die arbitration circuit 152 (e.g., the arbitration circuit 112) may determine the die associated with the client requests 212a-212f. The die associated with the client requests 212a-212n may comprise the die data 208. Next, the method 450 may move to the step 458 and the step 460. For example, the steps 458-460 may be performed in parallel or substantially in parallel.

In the step 458, the bank data 210 of the client request may be enqueued (e.g., pushed) into one of the bank circuits 160a-160k that corresponds to the same die as the RQUE circuit 102 that received the client request. For example, if the RQUE circuit 102 that received the client requests corresponds with die 1, then the bank data 210 may be pushed into the bank circuit 160b (e.g., the bank circuit 160a may correspond to die 0, the bank circuit 160b may correspond to die 1, the bank circuit 160c may correspond to die 2, etc.). The bank circuits 160a-160k may be enqueued in a first-in, first-out order with the bank data corresponding to the earliest client requests stored in the row 214a, the next earliest client request stored in the row 214b, the next earliest client request stored in the row 214c, etc. Next, the method 450 may move to the step 462.

In the step 460, the die data 208 of the client request may be enqueued (e.g., pushed) into the die-bank circuit 162. The die data 208 may be enqueued in the die-bank circuit 162 when the client request is received by the RQUE circuit 102 regardless of which of the dies 80a-80k that the RQUE circuit 102 corresponds to. For example, the die-bank circuit 162 may enqueued for each of the client request 212a-212n. The die-bank circuit 162 may be enqueued in a first-in, first-out order with the die data corresponding to the earliest client requests stored in the row 216a, the next earliest client request stored in the row 216b, the next earliest client request stored in the row 216c, etc. Next, the method 450 may move to the step 462.

In the step 462, the set arbitration logic 176 and/or the die arbitration logic 186 may peek ahead at the upcoming commands enqueued in the sideband queue (e.g., the bank circuits 160a-160k and/or the die-bank circuit 162). The set arbitration logic 176 and/or the die arbitration logic 186 may peek at the bank-set information and/or the bank ID stored. Next, in the step 464, the set arbitration logic 176 and/or the die arbitration logic 186 may prioritize the upcoming commands while maintaining an order of the client requests. The client requests order may be maintained to ensure that the CAS commands are performed in the order received. Next, the method 450 may move to the decision step 466.

In the decision step 466, the set arbitration logic 176 may determine whether an upcoming ACT/PCHG command (e.g., one of the commands received by the PQUE buffers 172a-172m) corresponds to a current one of the bank-set controllers 82a-82n. The current one of the bank-set controllers 82a-82n may comprise the bank-set controller that corresponds to the next CAS command. If the upcoming ACT/PCHG command does not correspond to the current one of the bank-set controllers 82a-82n, then the method 450 may move to the step 468. In the step 468, the set arbitration logic 176 may give the upcoming ACT/PCHG a lower priority. Next, the method 450 may move to the step 472. In the decision step 466, if the upcoming ACT/PCHG command does correspond to the current one of the bank-set controllers 82a-82n, then the method 450 may move to the step 470. In the step 470, the set arbitration logic 176 may give the upcoming ACT/PCHG a higher priority. Next, the method 450 may move to the step 472.

In the step 472, the set arbitration logic 176 and/or the die arbitration logic 186 may generate the command sequence for efficient page management to overlap the timings of the timers 178a-178j and/or the timers 188a-188i. Next, the method 450 may move to the step 474. The step 474 may end the method 450.

The functions performed by the diagrams of FIGS. 1-9 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (erasable programmable ROMs), EEPROMs (electrically erasable programmable ROMs), UVPROMs (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, cloud servers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
a plurality of bank set arbitration circuits each (i) configured to receive first commands and second commands and (ii) comprising (a) a bank circuit configured to queue bank data and (b) a set arbitration logic configured to queue said second commands in response to said bank data and perform arbitration for said first commands and said second commands; and
a die arbitration circuit (i) configured to receive said first commands and said second commands from said plurality of bank set arbitration circuits and (ii) comprising (a) a die-bank circuit configured to queue die data and (b) a die arbitration logic configured to queue said second commands in response to said die data and perform arbitration for said first commands and said second commands, wherein
queuing said bank data and said die data for said second commands enables said apparatus to perform said first commands that correspond to a bank set controller that corresponds to an open page before said first commands that correspond to a bank set controller that does not correspond to said open page.

2. The apparatus according to claim 1, wherein (i) said bank data is queued by said bank circuits in response to one or more memory operations, (ii) said die data is queued by said die-bank circuit in response to said memory operations, and (iii) queuing said bank data and said die data for said second commands further enables said apparatus to maintain an order of said memory operations for a random access memory.

3. The apparatus according to claim 1, wherein (i) said plurality of bank set arbitration circuits are configured to arbitrate said first commands and said second commands with multiple bank sets of a memory and (ii) said die arbitration circuit is configured to perform arbitration for a plurality of memory dies of said memory.

4. The apparatus according to claim 1, wherein (i) said plurality of bank set arbitration circuits are configured to manage inter bank timings according to timing constraints of a memory and (ii) said die arbitration circuit is configured to manage inter die timings according to said timing constraints of said memory.

5. The apparatus according to claim 1, wherein (i) said first commands comprise at least one of a precharge command and an activate command for upcoming memory operations, (ii) said second commands comprise at least one of a column address strobe (CAS) command and an activate command for memory operations that correspond to said open page and (iii) said bank set controller that corresponds to said open page comprises a bank set controller for said CAS command that will be issued next.

6. The apparatus according to claim 1, wherein (i) said first commands and said second commands are presented to a plurality of bank set controllers from a plurality of memory bank controllers, (ii) each of said memory bank controllers comprise (a) a plurality of page circuits configured to queue data for said first commands, (b) a common request circuit configured to queue said first commands and said second commands and (c) bank arbitration logic configured to perform arbitration for said first commands and (iii) said memory bank controllers are configured to arbitrate said first commands and said second commands with multiple banks in a bank set of a memory.

7. The apparatus according to claim 6, wherein said apparatus is further configured to enable training commands and refresh commands to be inserted into any of said bank arbitration logic, said plurality of bank set arbitration circuits and said die arbitration circuit.

8. The apparatus according to claim 6, wherein (i) said plurality of memory bank controllers, said plurality of bank set arbitration circuits and said die arbitration circuit are implemented in a hierarchical arbitration structure configured to fan out memory operations to one of said memory bank controllers, then to one of said plurality of bank set arbitration circuits and then to said die arbitration circuit while maintaining an ordering of said memory operations and (ii) said hierarchical arbitration structure is configured to restrict said memory operations to a corresponding group of bank controllers in a bank set.

9. The apparatus according to claim 6, wherein said plurality of page circuits and said common request circuit are configured to implement a memory operation buffering scheme by sharing data about upcoming memory operations between said common request circuit and said plurality of page circuits.

10. The apparatus according to claim 1, wherein (i) said bank circuit implemented by each of said bank set arbitration circuits and said die-bank circuit are configured to implement a sideband ordering queue and (ii) said sideband ordering queue enables said apparatus to peek ahead at said bank data and said die data to determine a priority for a command sequence.

11. A method for implementing a hierarchical arbitration structure for a random access memory, comprising the steps of:
receiving first commands and second commands in a plurality of bank set arbitration circuits;
receiving client requests;
queue bank data in response to the client requests;
queue said second commands in response to said bank data in a set arbitration logic;
perform arbitration for said first commands and said second commands using said set arbitration logic;
receive said first commands and said second commands from said plurality of bank set arbitration circuits at a die arbitration circuit;
queue die data in response to said client requests;
queue said second commands in a die arbitration logic in response to said die data; and
perform arbitration for said first commands and said second commands using said die arbitration logic, wherein queuing said bank data and said die data for said second commands enables
(i) an order of said client requests to be maintained for said random access memory and (ii) said first commands that correspond to a current bank set controller to be prioritized over said first commands that correspond to a non-current bank set controller.

12. The method according to claim 11, wherein (i) said bank data is queued in a bank circuit implemented by each of said bank set arbitration circuits and (ii) said die data is queued in a die-bank circuit implemented by said die arbitration circuit.

13. The method according to claim 12, wherein prioritizing said first commands that correspond to said current bank set controller over said first commands that correspond to said non-current bank set controller enables said client requests that correspond to an earlier position in said bank circuits to be performed before said client requests that correspond to a later position in said bank circuits.

14. The method according to claim 12, wherein (i) said bank circuit corresponds to a memory die of said random access memory, (ii) said bank circuit is configured to receive said bank data in response to said client requests received by a common request circuit implemented in a bank set controller that corresponds to said memory die that corresponds to said bank circuit, (iii) said set arbitration logic is configured to ensure said second commands are generated in a same order as a corresponding one of said client requests and (iv) said second commands arbitrated by said set arbitration logic are presented to a CAS queue of said die arbitration circuit.

15. The method according to claim 14, wherein (i) said die-bank circuit is configured to receive said die data in response to said client requests received by any of a plurality of common request circuits associated with any of a plurality of memory dies of said random access memory and (ii) said die arbitration logic is configured to determine a command priority for said random access memory in response to said die data.

16. The method according to claim 15, wherein said command priority is configured to enable efficient page management to prevent waiting for a CAS command by closing or opening a page for a future one of said client requests in advance to overlap with timing data.

17. The method according to claim 12, wherein (i) each of said bank circuits corresponds to a particular die of said random access memory, (ii) said bank data is stored in one of said bank circuits that corresponds to said particular die that is the same as a die of one of said client requests and (iii) said bank data enables said set arbitration logic to ensure that inter-bank specific timings are accounted for when said client requests are pushed to downstream logic.

18. The method according to claim 11, wherein said die arbitration logic is configured to order a priority of said client requests for (i) said second commands from a current die, (ii) a pending sub-command for a previous one of said first commands, (iii) said first commands from said current die and then (iv) said first commands from dies other than said current die.

19. The method according to claim 11, wherein said method decouples arbitration stages for said random access memory.

20. The method according to claim 11, wherein said random access memory comprises a banks and pages structure.

* * * * *